(12) United States Patent
Chandolu et al.

(10) Patent No.: US 12,211,746 B2
(45) Date of Patent: Jan. 28, 2025

(54) METHODS USED IN FORMING A MEMORY ARRAY COMPRISING STRINGS OF MEMORY CELLS INCLUDING FORMING A PAIR OF ELEVATIONALLY-EXTENDING WALLS THAT ARE LATERALLY-SPACED RELATIVE ONE ANOTHER AND THAT ARE INDIVIDUALLY HORIZONTALLY-LONGITUDINALLY-ELONGATED

(71) Applicant: Micron Technology, Inc., Boise, ID (US)

(72) Inventors: Anilkumar Chandolu, Boise, ID (US); Indra V. Chary, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 315 days.

(21) Appl. No.: 17/231,895

(22) Filed: Apr. 15, 2021

(65) Prior Publication Data

US 2022/0336278 A1    Oct. 20, 2022

(51) Int. Cl.
   *H01L 21/768* (2006.01)
   *H01L 23/535* (2006.01)
   (Continued)

(52) U.S. Cl.
   CPC .. *H01L 21/76895* (2013.01); *H01L 21/76805* (2013.01); *H01L 23/535* (2013.01); *H10B 41/27* (2023.02); *H10B 43/27* (2023.02)

(58) Field of Classification Search
   CPC ........ H10B 41/50; H10B 43/50; H10B 41/35; H10B 43/35; H10B 41/27; H10B 43/27;
   (Continued)

(56) References Cited

U.S. PATENT DOCUMENTS

| 6,066,869 A | 5/2000 | Noble et al. |
| 8,492,278 B2 | 7/2013 | Good et al. |

(Continued)

FOREIGN PATENT DOCUMENTS

| CN | 1950940 | 4/2007 |
| CN | 104659033 | 5/2015 |

(Continued)

OTHER PUBLICATIONS

Jang et al., "Vertical Cell Array Using TCAT (Terabit Cell Array Transistor) Technology for Ultra High Density NAND Flash Memory", IEEE, Symposium on VLSI Technology Digest of Technical Papers, United States, 2009, pp. 192-193.

(Continued)

*Primary Examiner* — William B Partridge
*Assistant Examiner* — David Paul Sedorook
(74) *Attorney, Agent, or Firm* — Wells St. John P.S.

(57) ABSTRACT

A method used in forming a memory array comprising strings of memory cells comprises forming a stack comprising vertically-alternating first tiers and second tiers. Horizontally-elongated trenches are formed into the stack to form laterally-spaced memory-block regions. The memory-block regions comprise part of a memory-plane region. A pair of elevationally-extending walls are formed that are laterally-spaced relative one another and that are individually horizontally-longitudinally-elongated. The pair of walls are one of (a) or (b), where: (a): in the memory-plane region laterally-between immediately-laterally-adjacent of the memory-block regions; and (b): in a region that is edge-of-plane relative to the memory-plane region. Through the horizontally-elongated trenches and after forming the pair of walls, sacrificial material that is in the first tiers is isotropically etching away and replaced with conducting material of (Continued)

individual conducting lines. Other embodiments, including structure independent of method, are disclosed.

23 Claims, 22 Drawing Sheets

(51) Int. Cl.
H10B 41/27 (2023.01)
H10B 43/27 (2023.01)

(58) Field of Classification Search
CPC ......... H01L 27/11575; H01L 27/11548; H01L 27/1157; H01L 27/11524; H01L 27/11582; H01L 27/11556
See application file for complete search history.

(56) References Cited

U.S. PATENT DOCUMENTS

| | | | |
|---|---|---|---|
| 8,735,216 B2 | 3/2014 | Liu et al. | |
| 8,980,752 B2 | 3/2015 | Good et al. | |
| 9,230,984 B1 | 1/2016 | Takeguchi | |
| 9,786,673 B1 | 10/2017 | Cho et al. | |
| 9,893,083 B1 | 2/2018 | Wang et al. | |
| 9,997,353 B1 | 6/2018 | Kumar et al. | |
| 10,014,309 B2 | 7/2018 | Dorhout et al. | |
| 10,236,301 B1 | 3/2019 | Howder et al. | |
| 10,269,820 B1 | 4/2019 | Kaminaga | |
| 10,290,643 B1 | 5/2019 | Kai et al. | |
| 10,381,377 B2 | 8/2019 | Wang et al. | |
| 10,388,665 B1 | 8/2019 | Xie et al. | |
| 10,446,578 B1 | 10/2019 | Howder et al. | |
| 10,553,607 B1 | 2/2020 | Howder et al. | |
| 11,444,093 B2 | 9/2022 | Tiwari | |
| 2005/0227426 A1 | 10/2005 | Deppe et al. | |
| 2008/0014761 A1 | 1/2008 | Bhatia et al. | |
| 2010/0133599 A1 | 6/2010 | Chae et al. | |
| 2011/0298013 A1 | 12/2011 | Hwang et al. | |
| 2012/0052672 A1 | 3/2012 | Nakanishi et al. | |
| 2012/0098050 A1 | 4/2012 | Shim et al. | |
| 2012/0119287 A1* | 5/2012 | Park | H10B 43/27 257/329 |
| 2012/0168829 A1 | 7/2012 | Zhong et al. | |
| 2012/0208347 A1 | 8/2012 | Hwang et al. | |
| 2013/0009236 A1 | 1/2013 | Lee et al. | |
| 2013/0140623 A1 | 6/2013 | Lee et al. | |
| 2015/0137216 A1 | 5/2015 | Lee et al. | |
| 2015/0206900 A1 | 7/2015 | Nam et al. | |
| 2015/0214241 A1 | 7/2015 | Lee | |
| 2015/0303214 A1 | 10/2015 | Kim et al. | |
| 2015/0318301 A1 | 11/2015 | Lee et al. | |
| 2015/0340377 A1 | 11/2015 | Lee | |
| 2016/0049421 A1 | 2/2016 | Zhang et al. | |
| 2016/0204117 A1 | 7/2016 | Liu et al. | |
| 2016/0268302 A1 | 9/2016 | Lee et al. | |
| 2016/0322381 A1 | 11/2016 | Liu et al. | |
| 2016/0336338 A1 | 11/2016 | Song et al. | |
| 2016/0336340 A1 | 11/2016 | Song et al. | |
| 2016/0343726 A1 | 11/2016 | Yune | |
| 2017/0062470 A1 | 3/2017 | Han et al. | |
| 2017/0148805 A1 | 5/2017 | Nishikawa et al. | |
| 2017/0250193 A1 | 8/2017 | Huo | |
| 2017/0256645 A1 | 9/2017 | Chung et al. | |
| 2017/0278859 A1 | 9/2017 | Sharangpani et al. | |
| 2017/0358594 A1 | 12/2017 | Lu et al. | |
| 2018/0047739 A1* | 2/2018 | Dorhout | H10B 43/10 |
| 2018/0122906 A1 | 5/2018 | Yu et al. | |
| 2018/0130814 A1 | 5/2018 | Lee | |
| 2018/0261615 A1 | 9/2018 | Minemura | |
| 2018/0261616 A1 | 9/2018 | Cho et al. | |
| 2018/0294273 A1 | 10/2018 | Liao et al. | |
| 2018/0308858 A1 | 10/2018 | Hopkins et al. | |
| 2018/0342528 A1 | 11/2018 | Lee | |
| 2019/0019724 A1 | 1/2019 | Chang et al. | |
| 2019/0043879 A1 | 2/2019 | Lu et al. | |
| 2019/0067182 A1 | 2/2019 | Lee | |
| 2019/0088671 A1 | 3/2019 | Greenlee et al. | |
| 2019/0206884 A1 | 7/2019 | Ng et al. | |
| 2019/0237476 A1 | 8/2019 | Lee et al. | |
| 2019/0312054 A1 | 10/2019 | Yun et al. | |
| 2019/0326313 A1* | 10/2019 | Cui | H10B 43/10 |
| 2019/0363100 A1 | 11/2019 | Lee et al. | |
| 2019/0393238 A1 | 12/2019 | Lim et al. | |
| 2020/0058673 A1* | 2/2020 | Nishikawa | H10B 43/40 |
| 2020/0098781 A1 | 3/2020 | Xiao | |
| 2020/0119036 A1* | 4/2020 | King | H10B 43/20 |
| 2020/0127005 A1 | 4/2020 | Otsu et al. | |
| 2020/0194373 A1 | 6/2020 | Baek et al. | |
| 2020/0295031 A1 | 9/2020 | Lue | |
| 2020/0312863 A1 | 10/2020 | Iwai et al. | |
| 2020/0388629 A1 | 12/2020 | Lee et al. | |
| 2020/0395373 A1 | 12/2020 | Huo et al. | |
| 2020/0395374 A1 | 12/2020 | Huo et al. | |
| 2020/0402890 A1 | 12/2020 | Chary et al. | |
| 2021/0043640 A1 | 2/2021 | Kawaguchi et al. | |
| 2021/0043647 A1 | 2/2021 | Kim et al. | |
| 2021/0050364 A1 | 2/2021 | Tapias et al. | |
| 2021/0057428 A1 | 2/2021 | Hu et al. | |
| 2021/0057433 A1 | 2/2021 | Zhang et al. | |
| 2021/0057439 A1 | 2/2021 | Tessariol et al. | |
| 2021/0057440 A1 | 2/2021 | Greenlee et al. | |
| 2021/0057441 A1 | 2/2021 | Xu et al. | |
| 2021/0111064 A1 | 4/2021 | Billingsley et al. | |
| 2021/0118899 A1 | 4/2021 | King et al. | |
| 2021/0125919 A1 | 4/2021 | Machkaoutsan et al. | |
| 2021/0125920 A1 | 4/2021 | Hu et al. | |
| 2021/0167020 A1* | 6/2021 | Greenlee | H01L 21/76847 |
| 2021/0202324 A1 | 7/2021 | Scarbrough et al. | |

FOREIGN PATENT DOCUMENTS

| | | |
|---|---|---|
| CN | 108573979 | 9/2018 |
| CN | 108735758 | 11/2018 |
| CN | 109545793 | 3/2019 |
| CN | 110034119 | 7/2019 |
| CN | 110047835 | 7/2019 |
| CN | 110088905 | 8/2019 |
| CN | 110112134 | 8/2019 |
| CN | 110114881 | 8/2019 |
| CN | 110211965 | 9/2019 |
| KR | 10-2014-0112827 | 9/2014 |
| KR | 10-2017-0066377 | 6/2017 |
| WO | WO 2020/252892 | 12/2020 |

OTHER PUBLICATIONS

U.S. Appl. No. 16/728,962, filed Dec. 27, 2019, by Scarbrough et al.

U.S. Appl. No. 16/739,581, filed Jan. 10, 2020, by Tiwari.

* cited by examiner

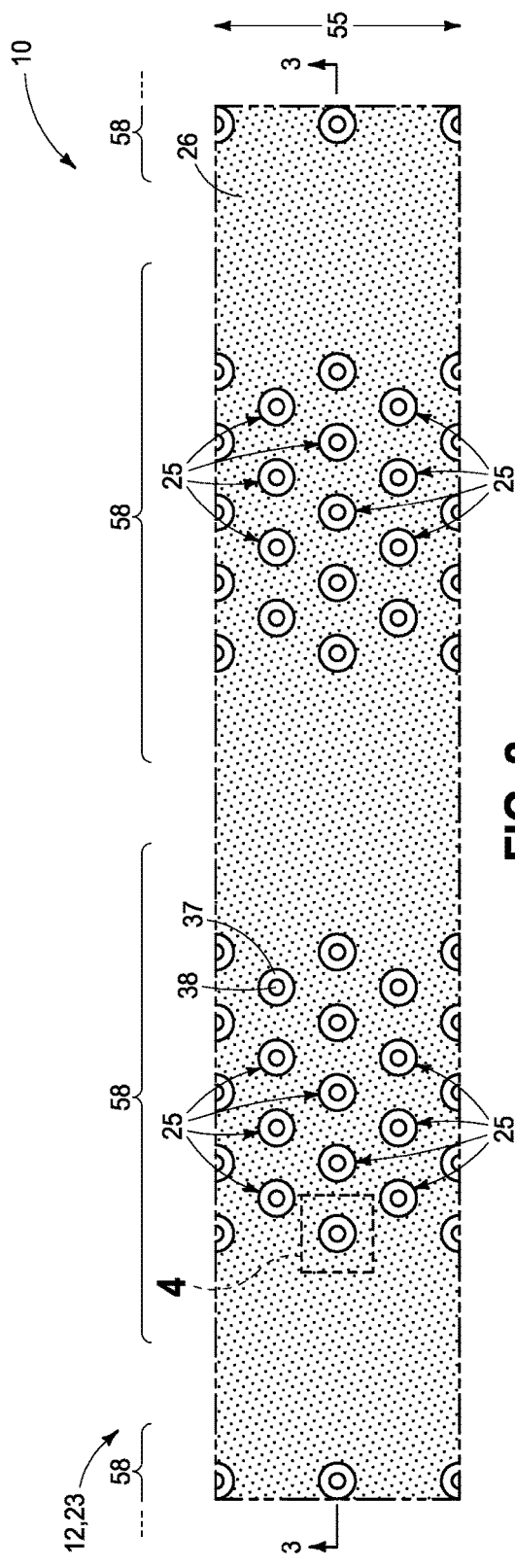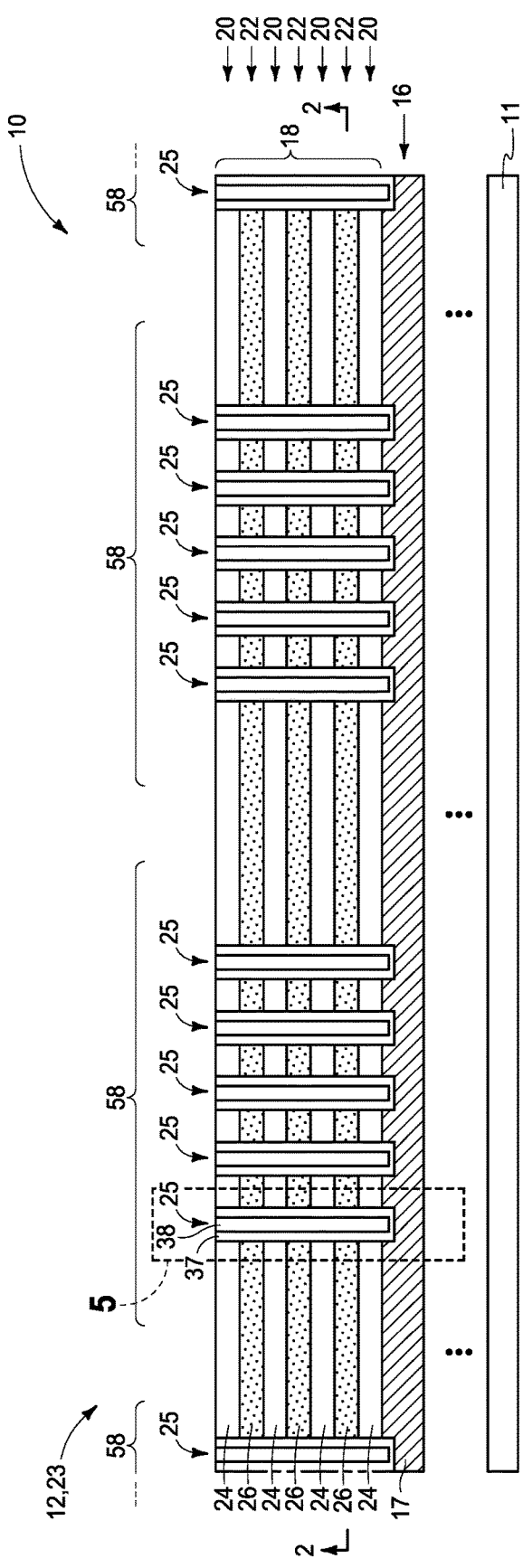
FIG. 2
FIG. 3

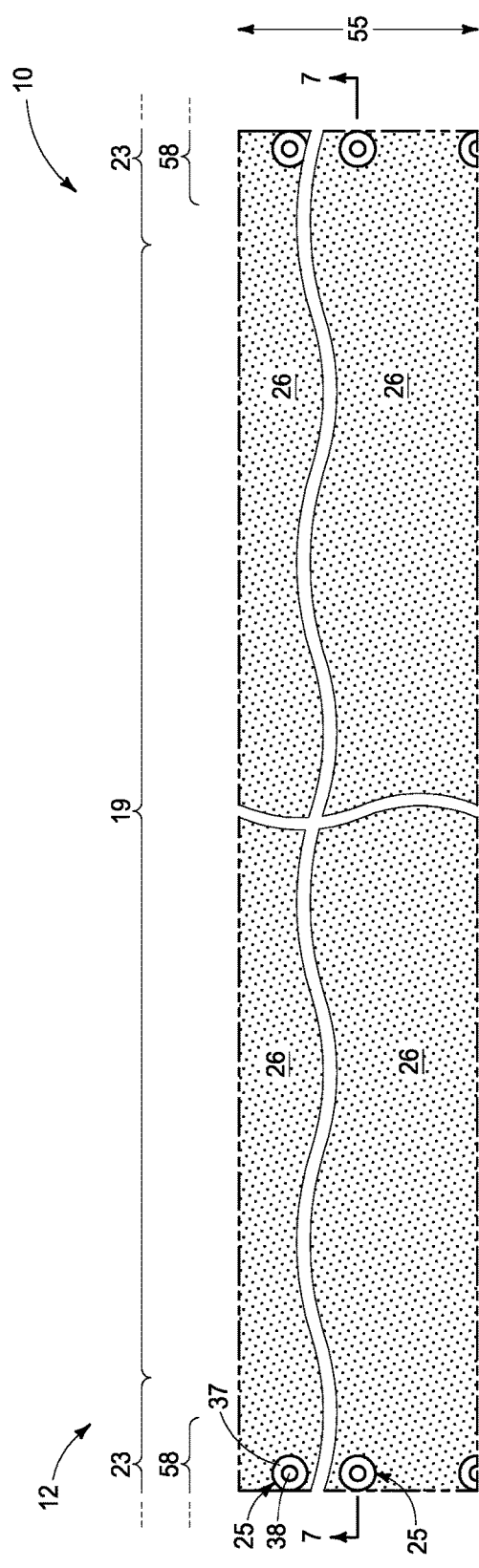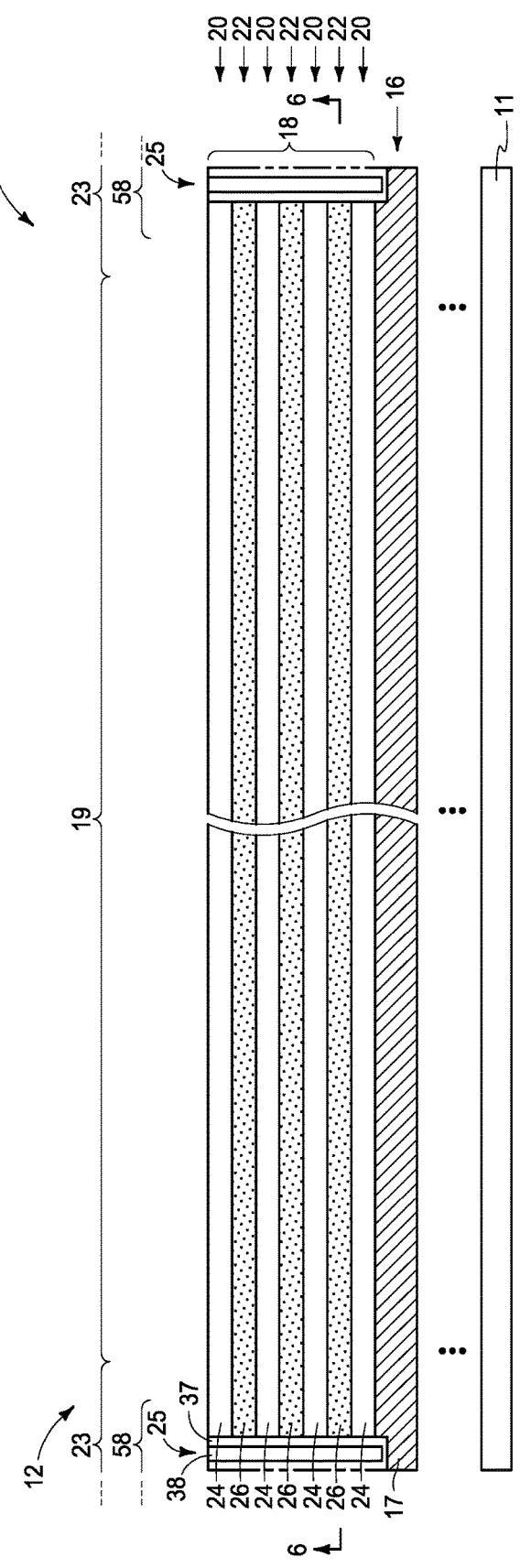

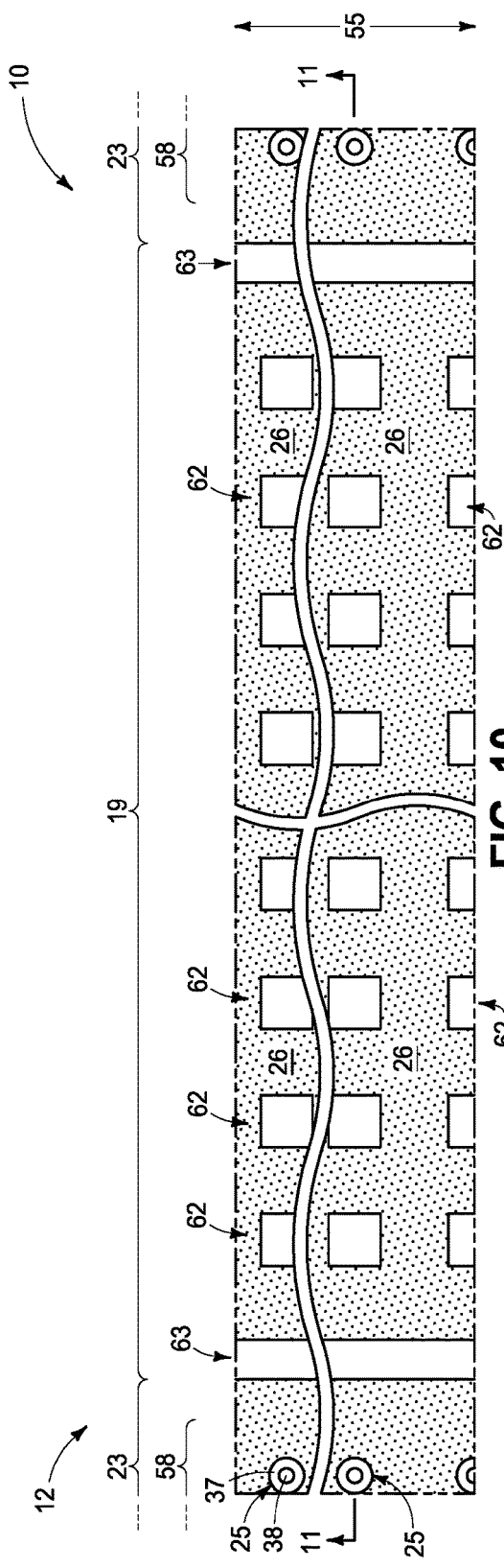
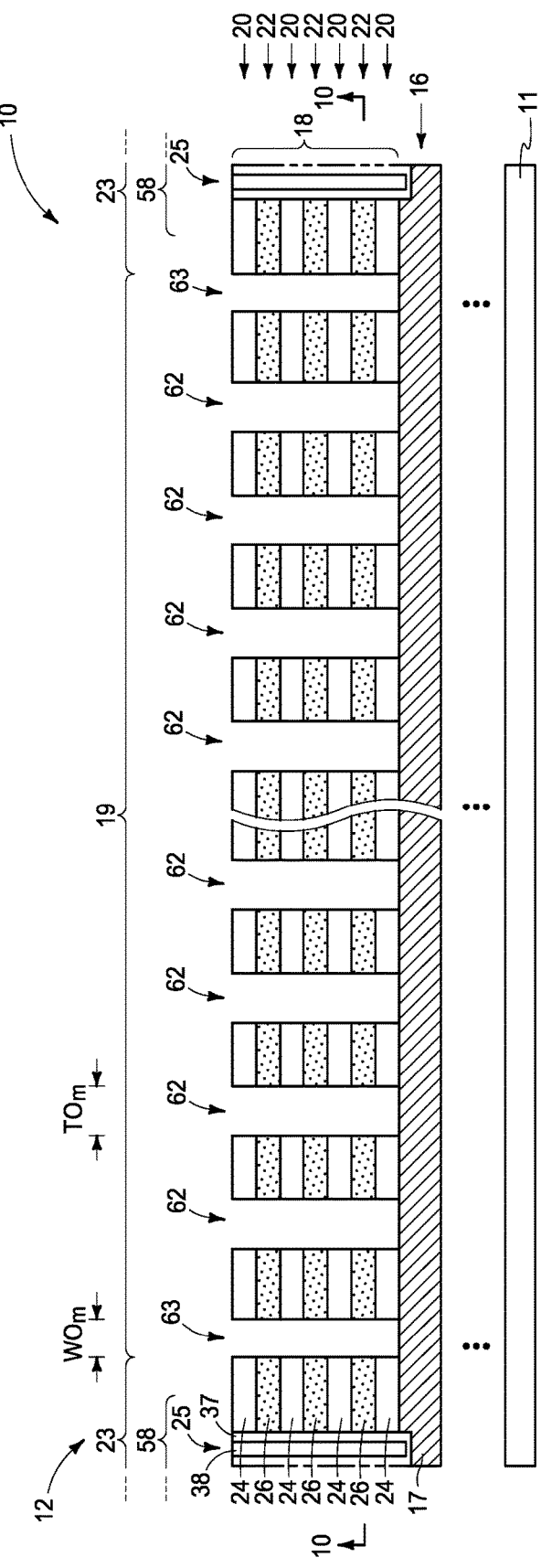
FIG. 10
FIG. 11

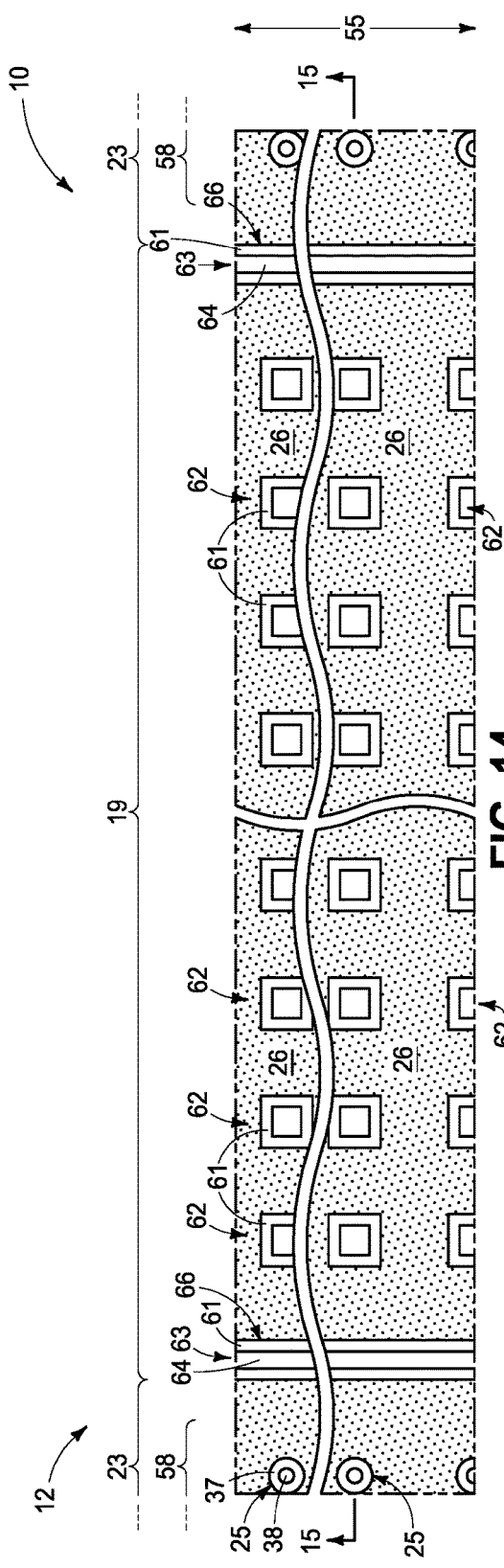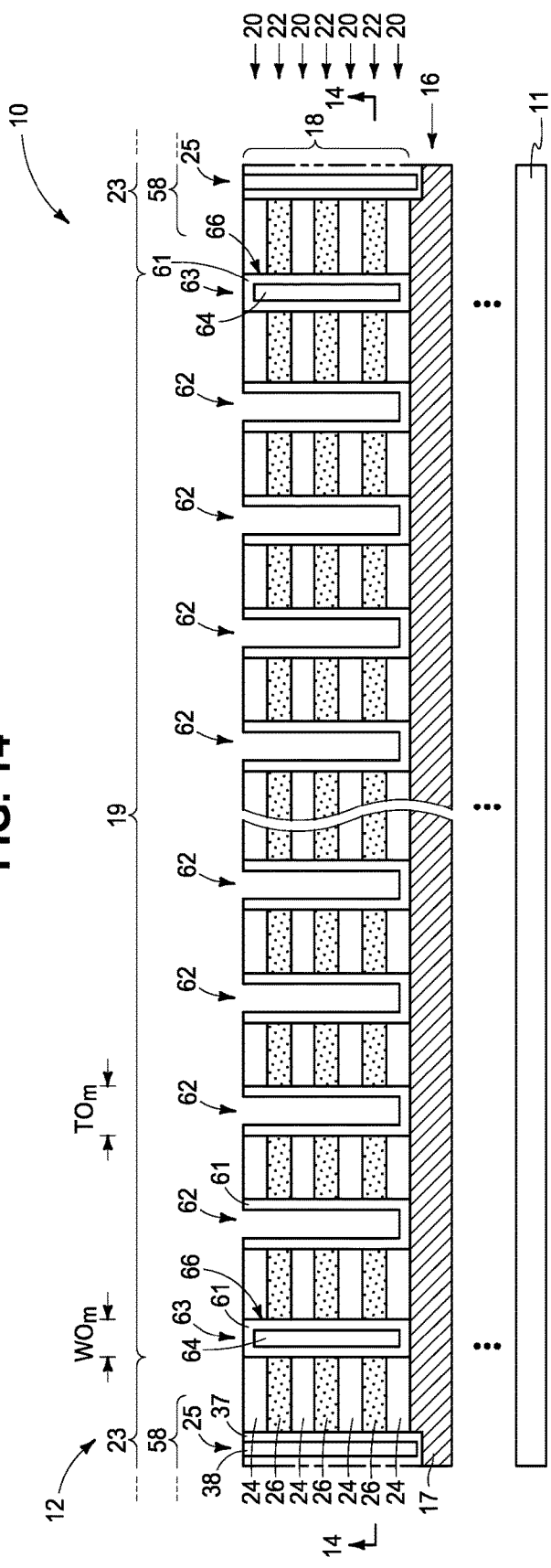

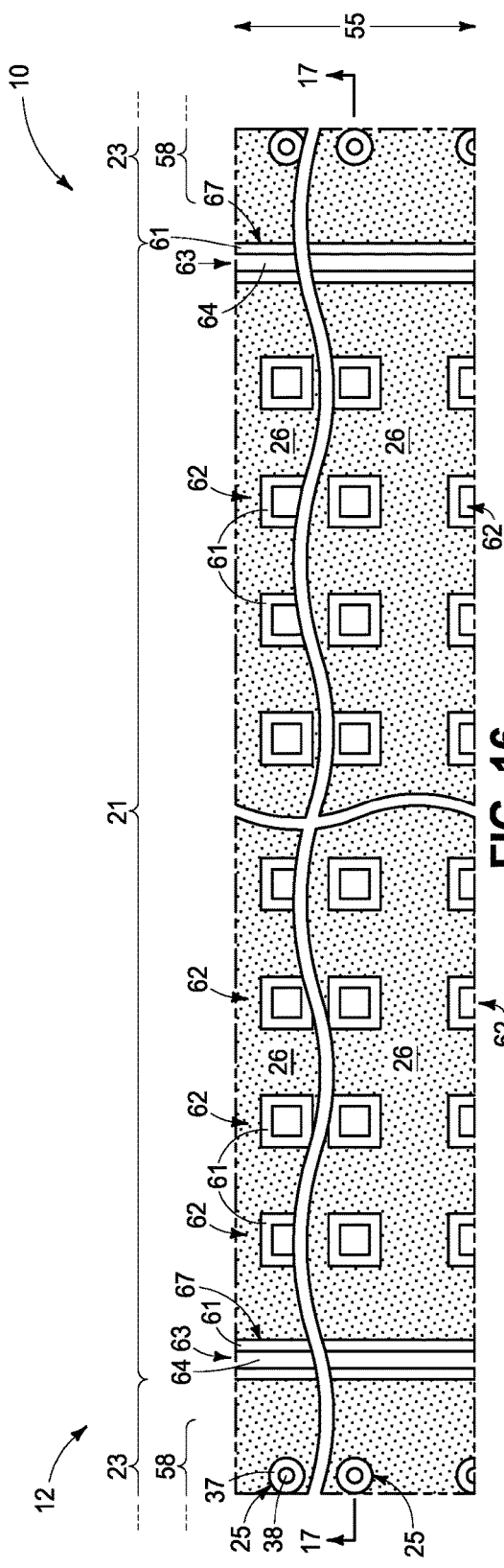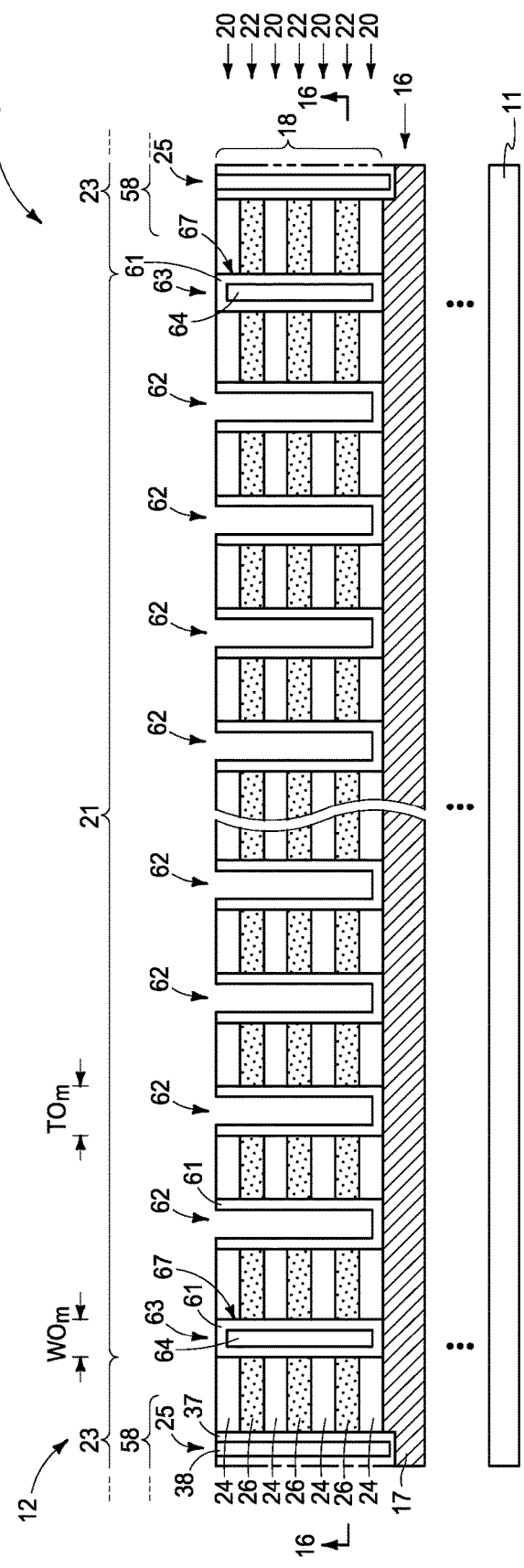

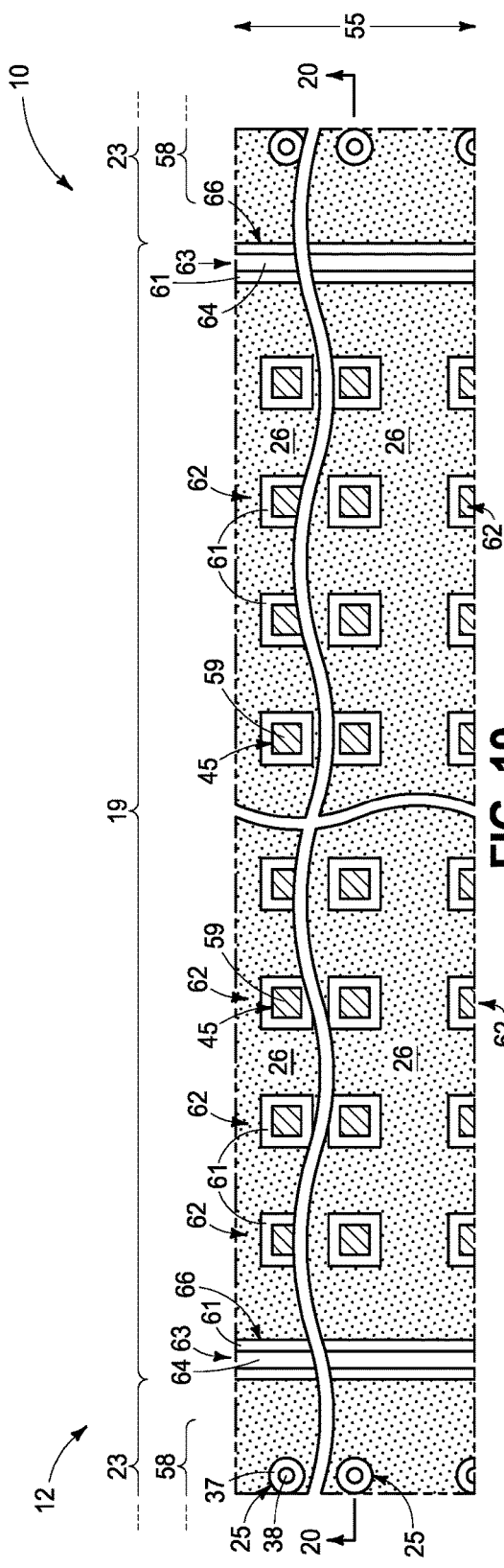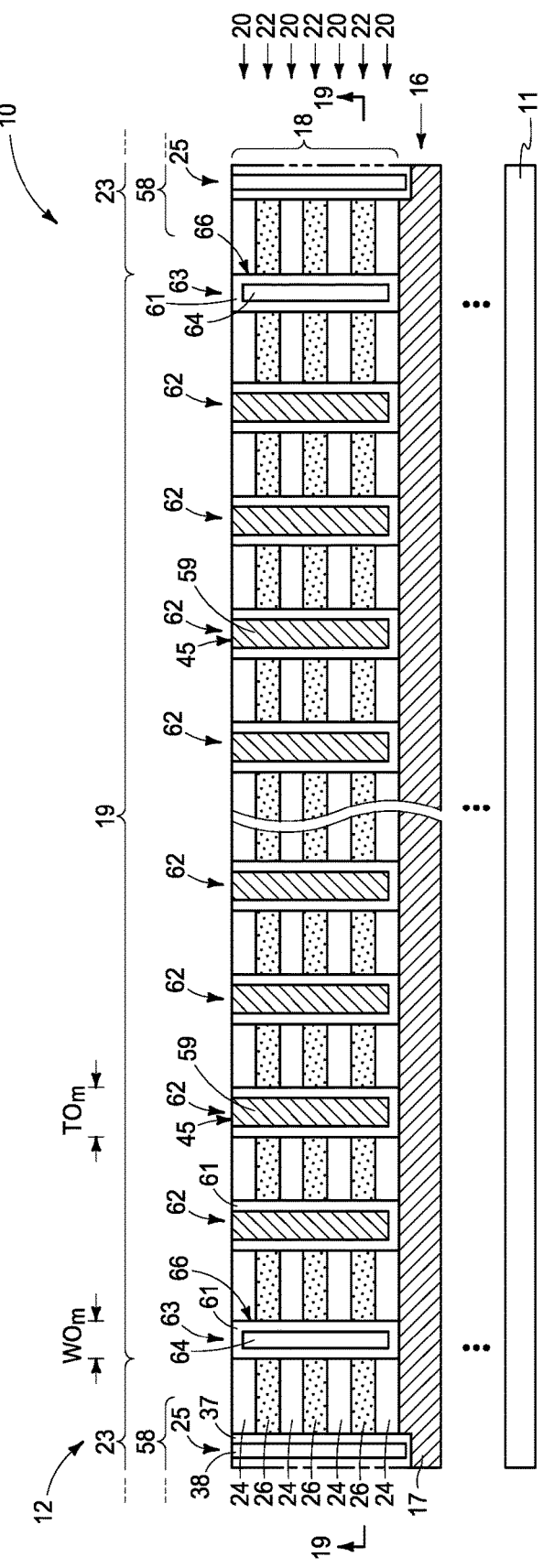

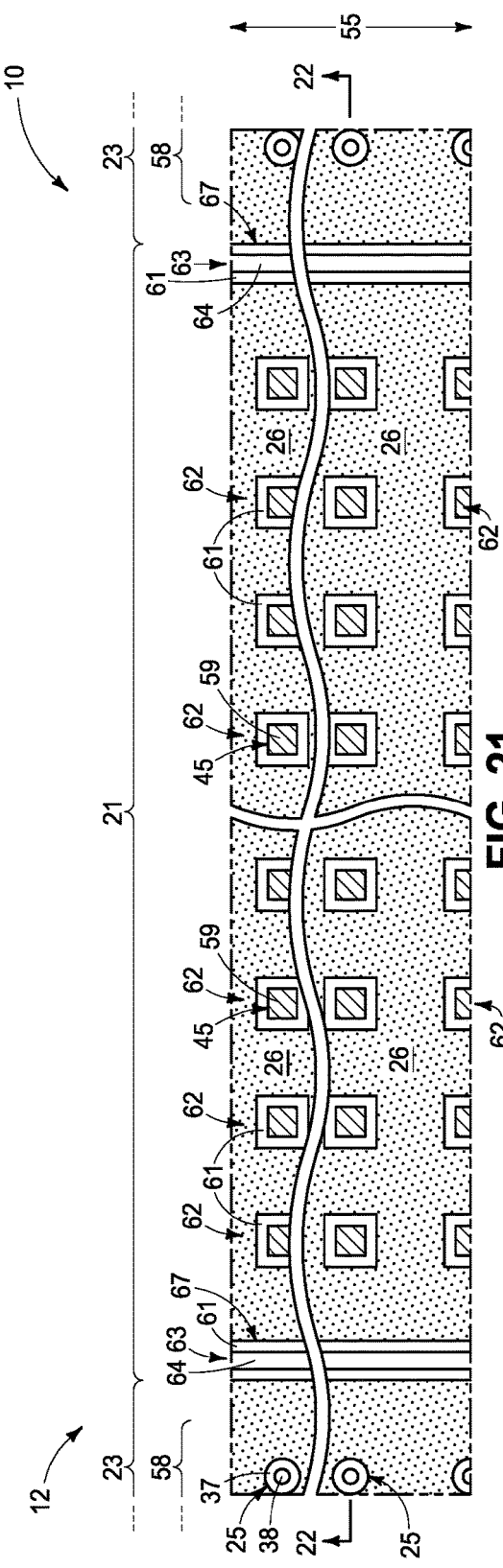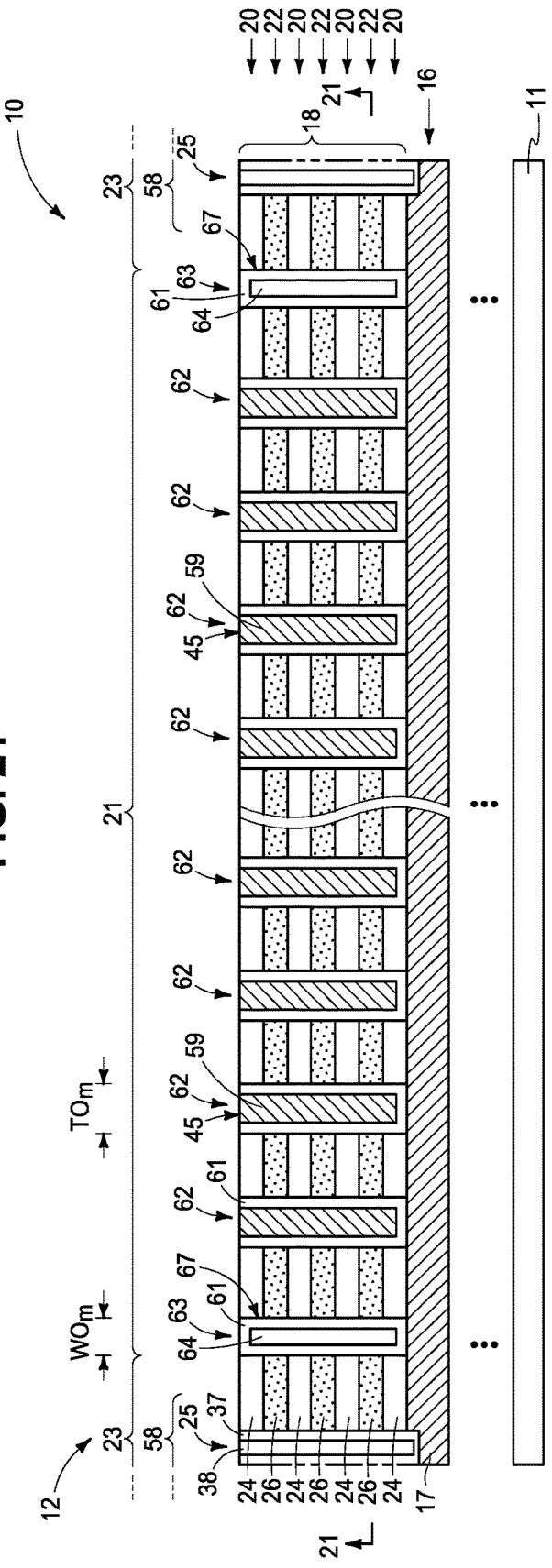

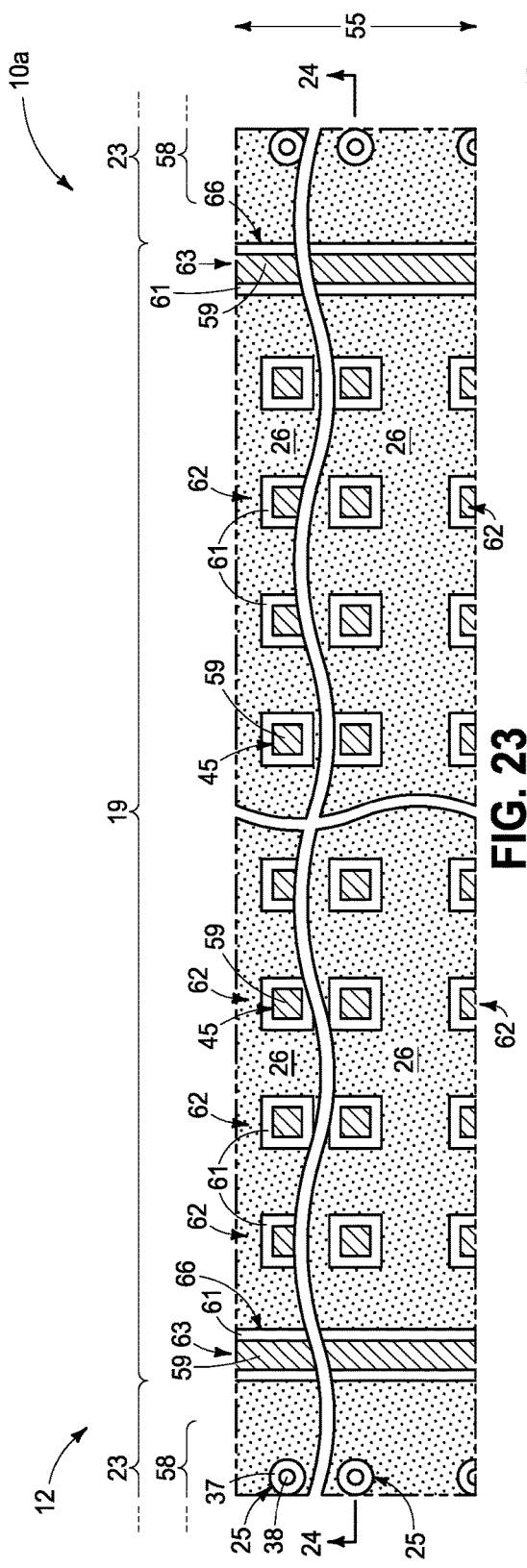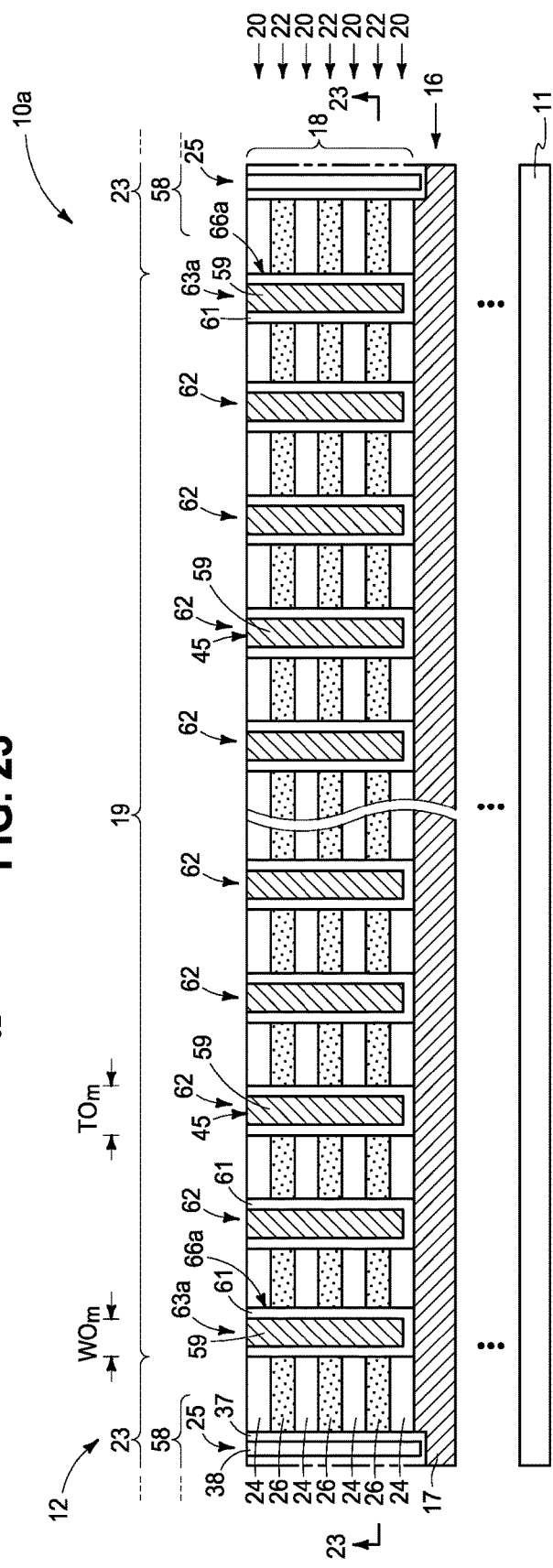

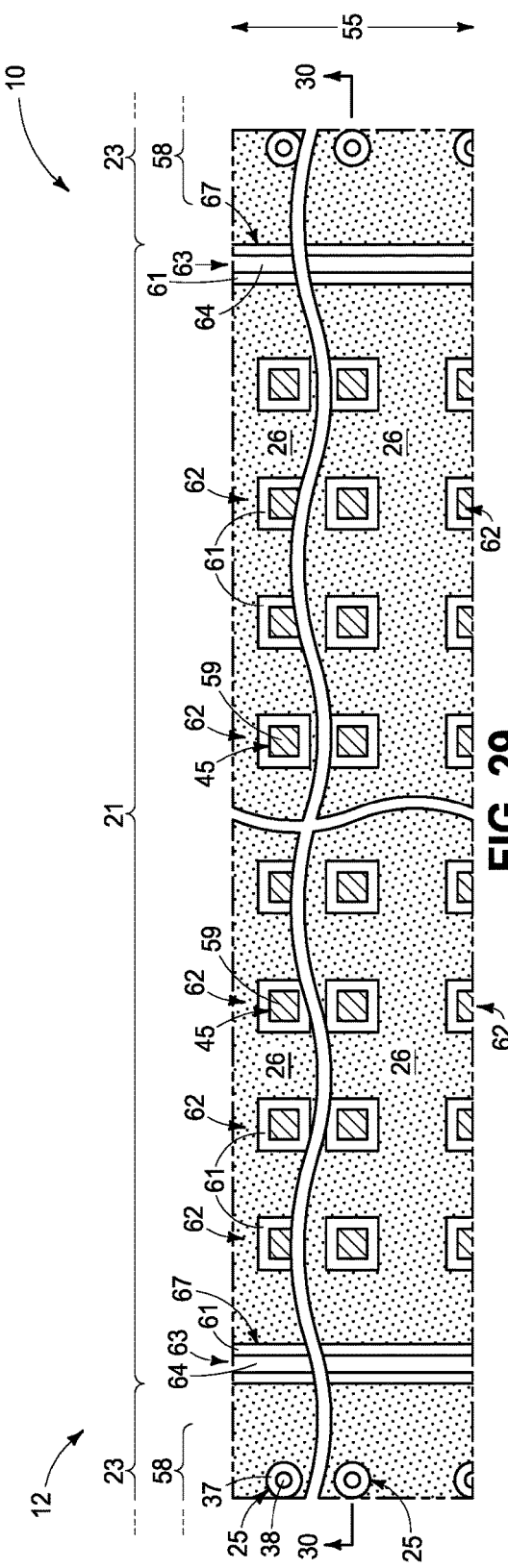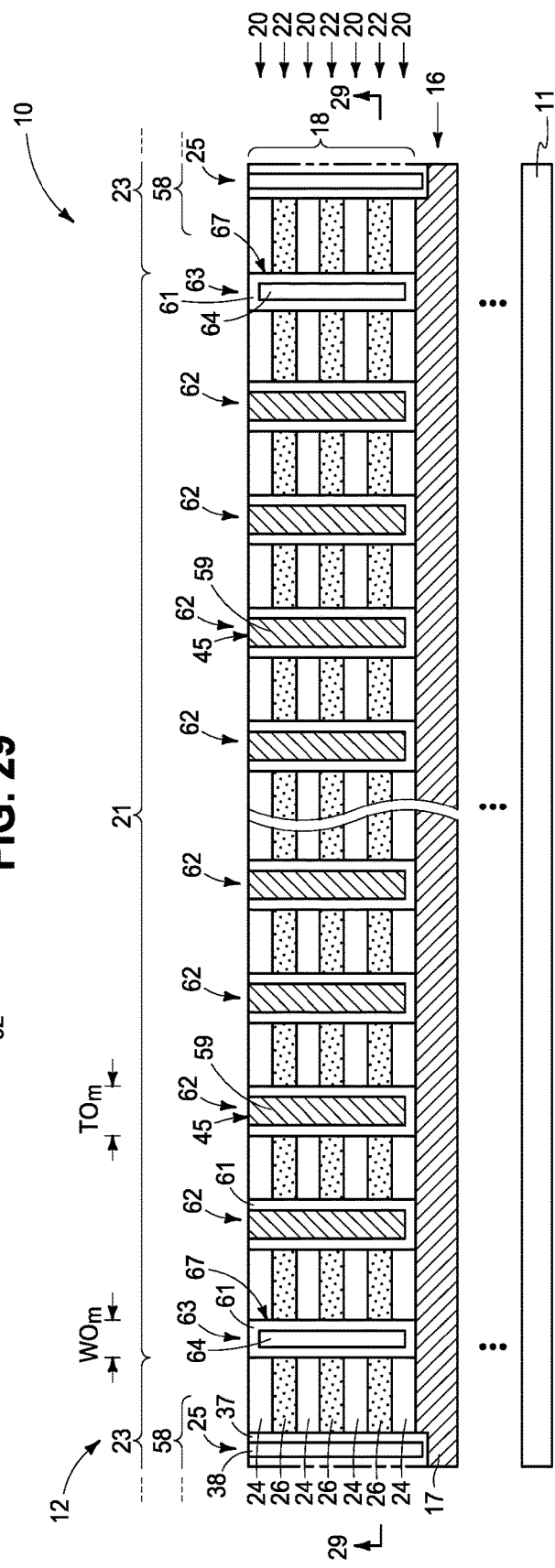

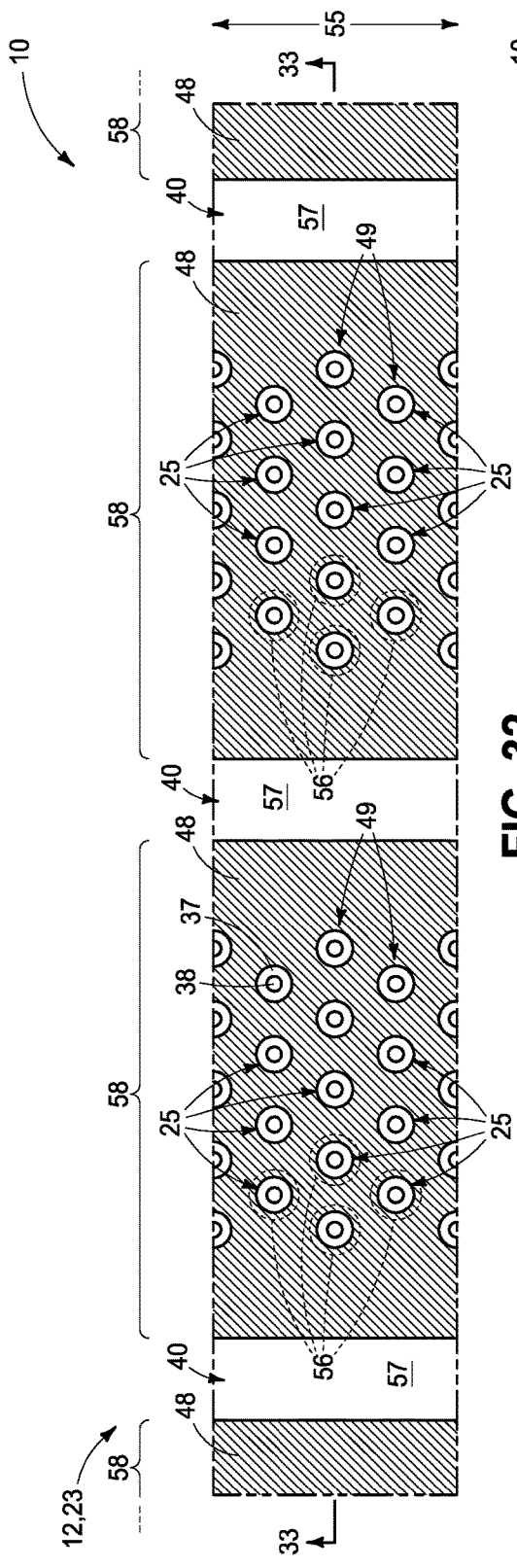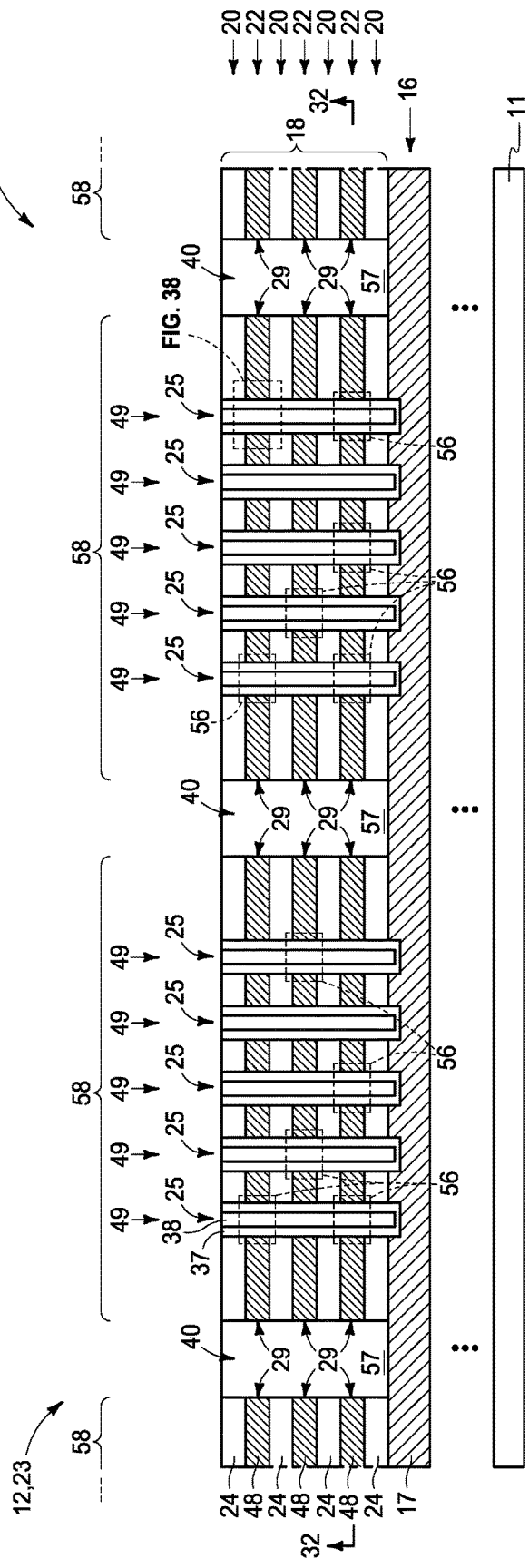

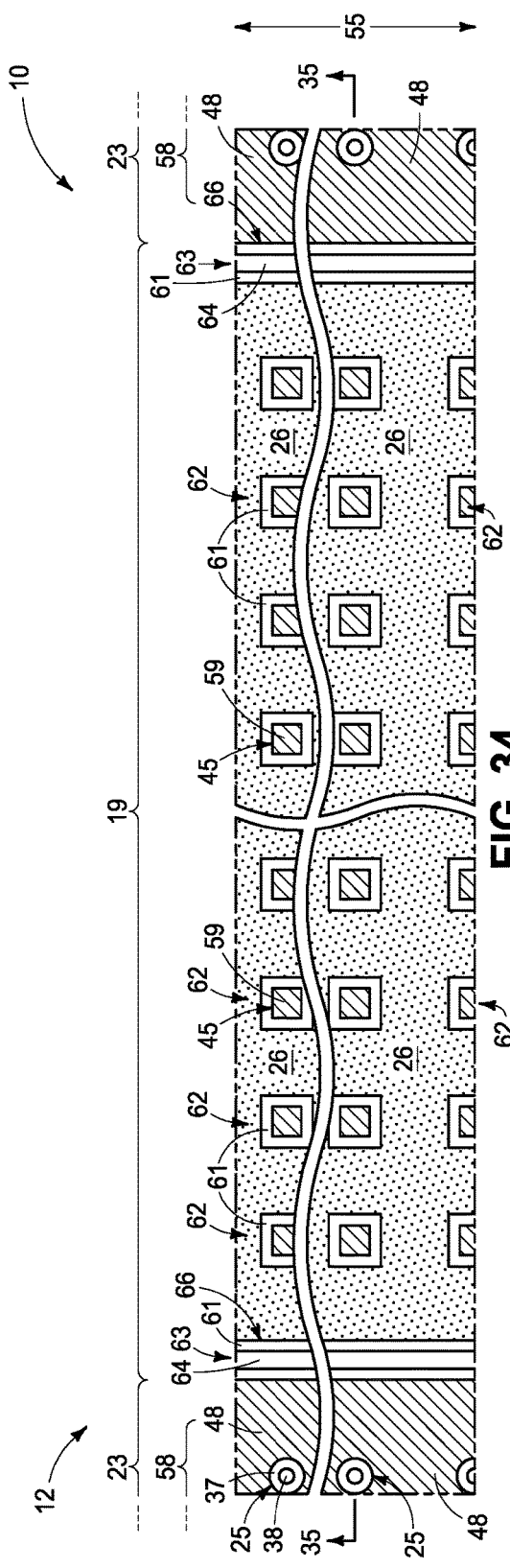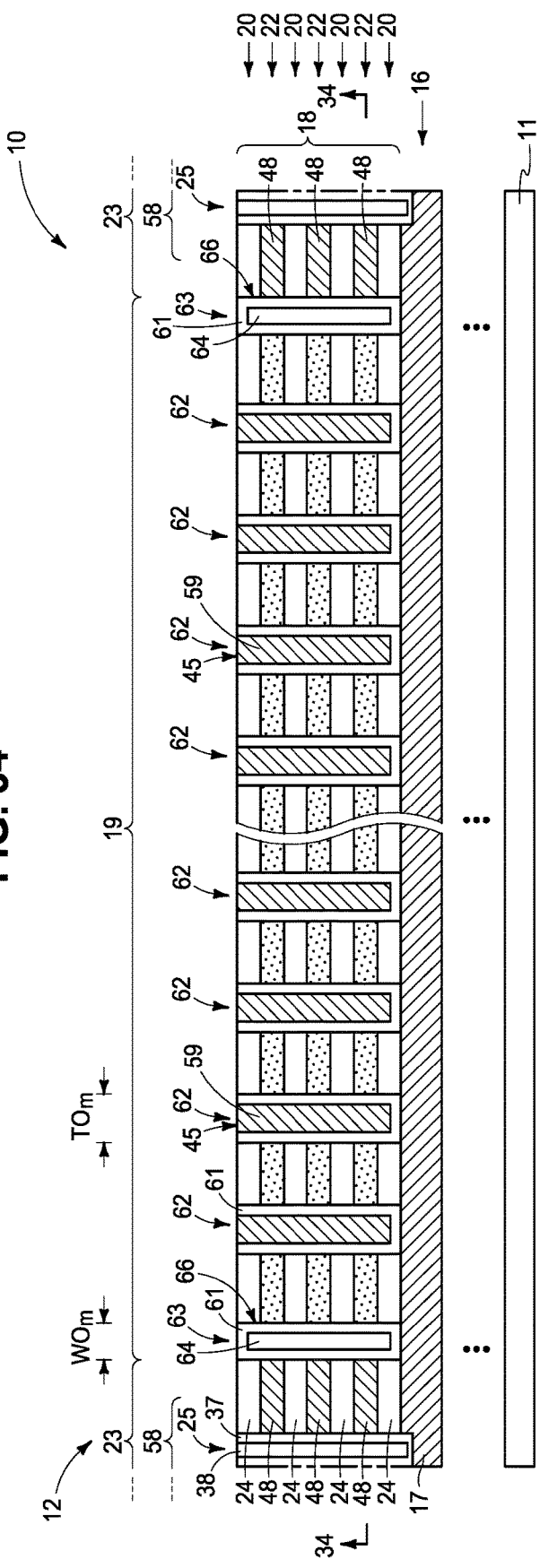

METHODS USED IN FORMING A MEMORY ARRAY COMPRISING STRINGS OF MEMORY CELLS INCLUDING FORMING A PAIR OF ELEVATIONALLY-EXTENDING WALLS THAT ARE LATERALLY-SPACED RELATIVE ONE ANOTHER AND THAT ARE INDIVIDUALLY HORIZONTALLY-LONGITUDINALLY-ELONGATED

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 2 is an enlarged diagrammatic cross-section view of a portion of FIG. 1 in process in accordance with an embodiment of the invention, and is through line 2-2 in FIG. 3.

FIG. 3 is a diagrammatic cross-section view through line 3-3 in FIG. 2.

FIGS. 4-39 are diagrammatic sequential sectional and/or enlarged views of the construction of FIGS. 1-3, or portions thereof or alternate and/or additional embodiments, in process in accordance with some embodiments of the invention.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are first described with reference to FIGS. 1-38 which may be considered as a "gate-last" or "replacement-gate" process. Further, and regardless, the following sequence of processing steps is but one example and other sequences of the example processing steps (with or without other processing steps) may be used regardless of whether using "gate-last/replacement-gate" processing.

Figure 1:
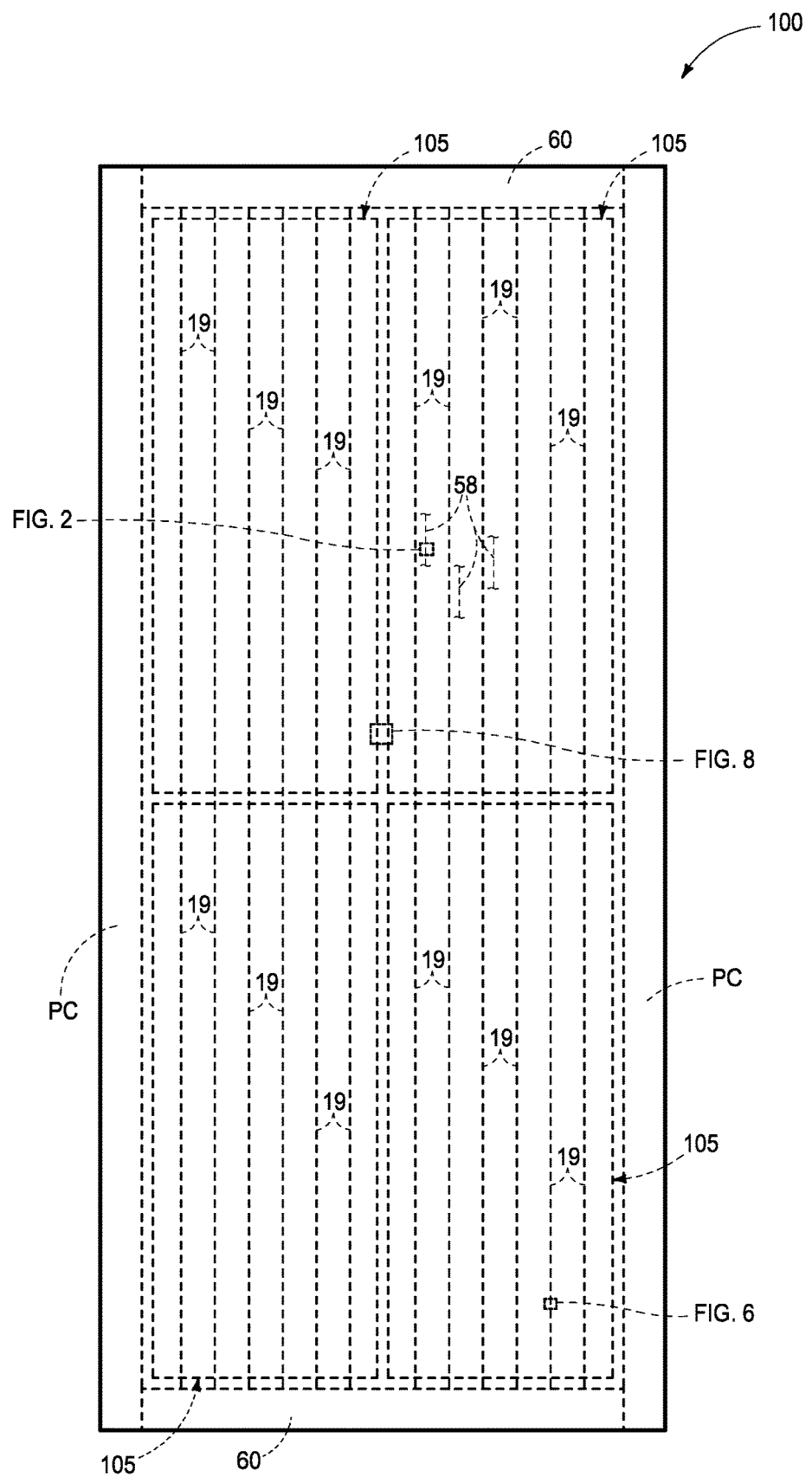
FIG. 1 is a diagrammatic top plan view of a die or die area that may be part of a larger substrate (e.g., a semiconductor wafer, and not shown).
Figure 5:
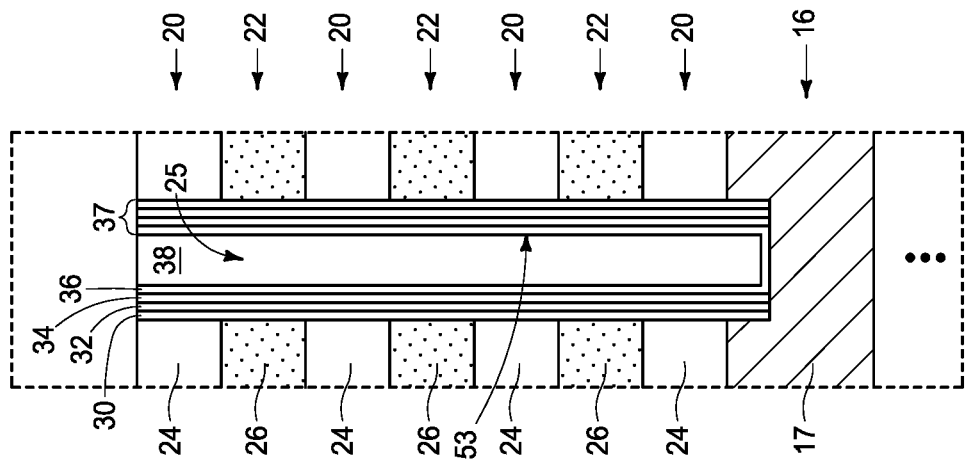
Figure 4:
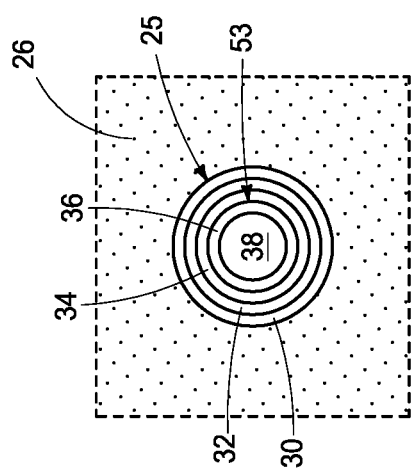
Figure 8:
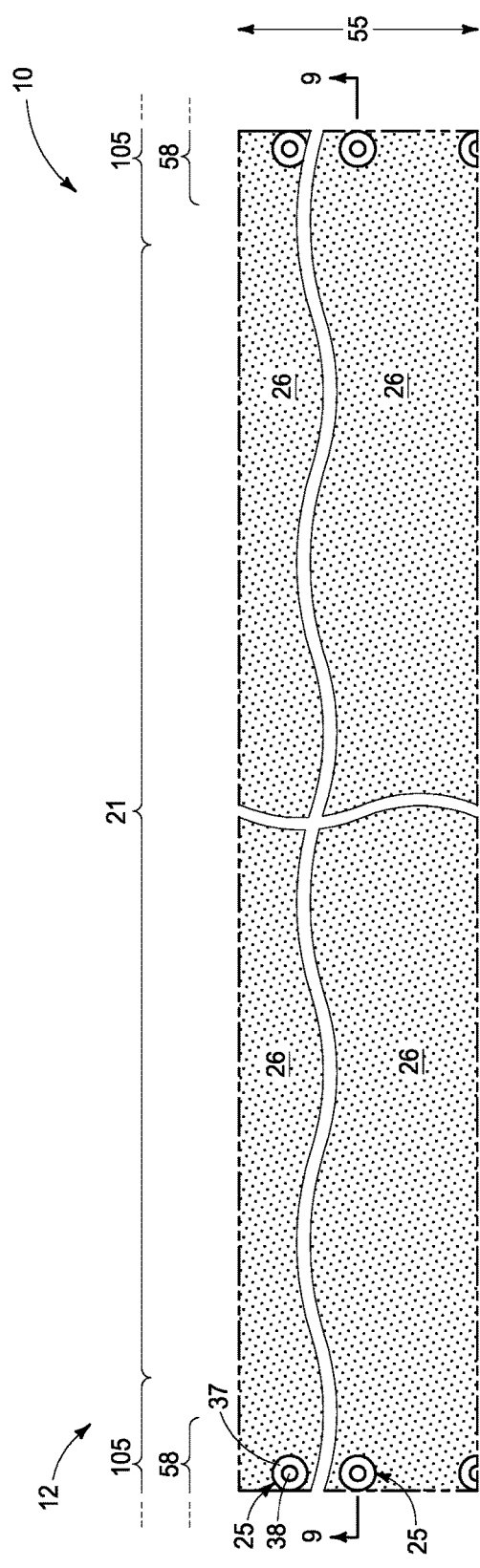
Figure 9:
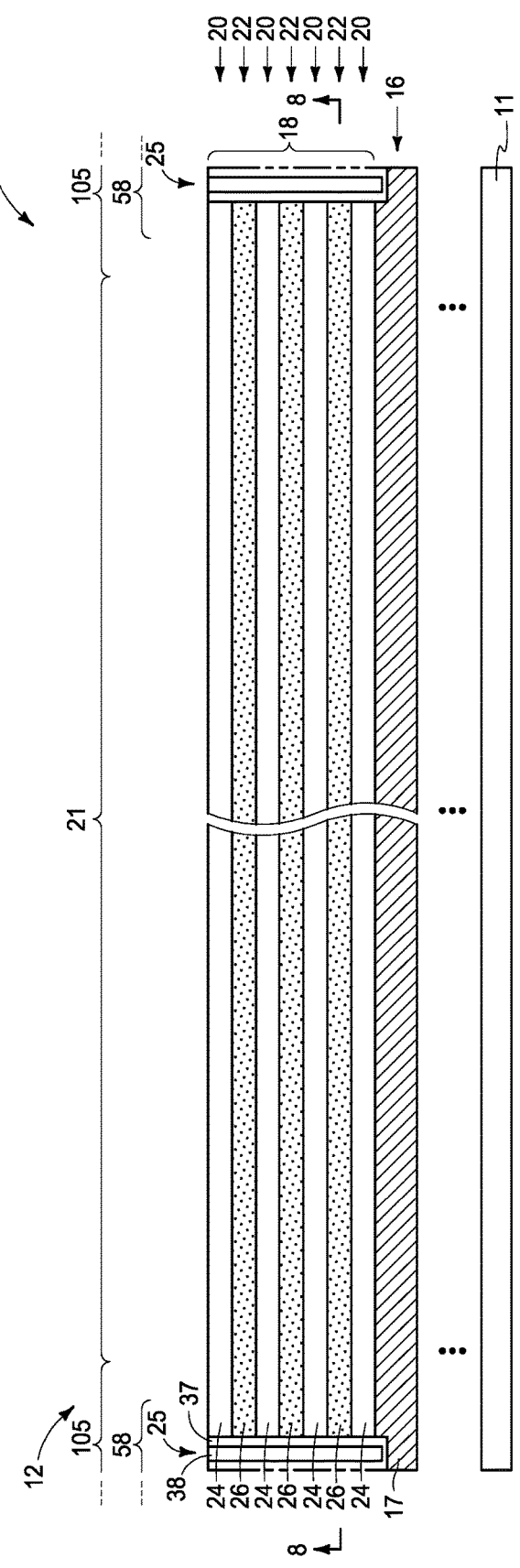
Figure 12:
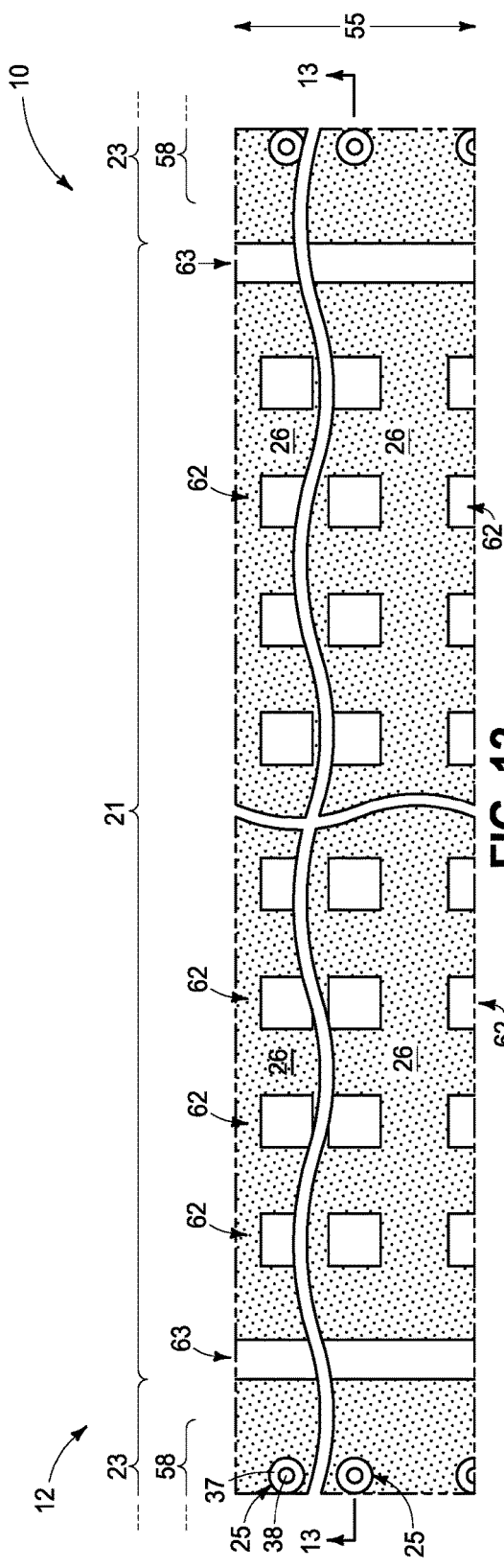
Figure 13:
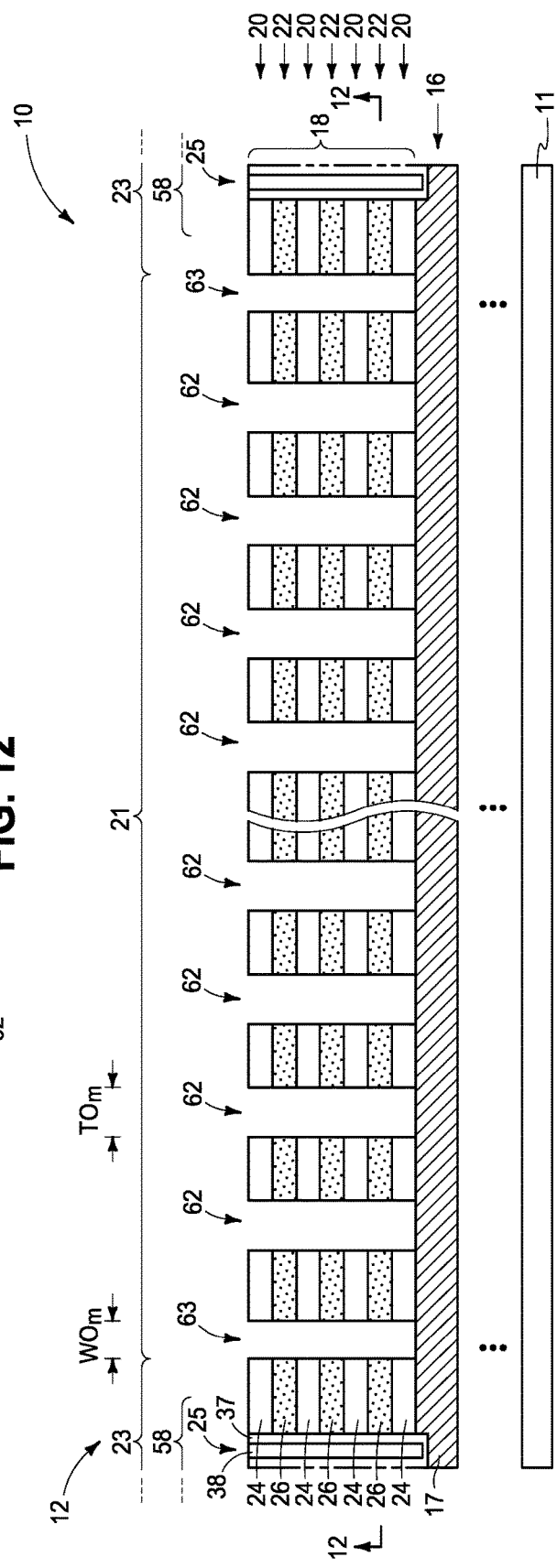

FIG. 1 shows an example diagrammatic embodiment comprising a die or die area 100 that may be part of a larger substrate (e.g., a semiconductor wafer, and not shown) and within which a memory array will be fabricated. Example die area 100 comprises at least one memory-plane region 105 (four being shown), memory-block regions 58 in individual memory-plane regions 105, a stair-step region 60 (two being shown at longitudinal ends of the memory planes), and a peripheral circuitry region PC (two being shown). In this document, "block" is generic to include "sub-block". Regions 105, 58, 60, and/or PC may not be discernable at this point of processing. FIGS. 2-9 are diagrammatic larger and varied scale views of portions of die area 100.

Referring to FIGS. 2-9, a construction 10 is shown in a method of forming an array or array region 12 of elevationally-extending strings of transistors and/or memory cells (not yet fabricated). Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 2-9-depicted materials. For example, other partially or wholly fabricated components of integrated circuitry may be provided somewhere above, about, or within base substrate 11. Control and/or other peripheral circuitry for operating components within an array (e.g., array 12 or memory-array region 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductive material 17 has been formed above substrate 11. Conductor tier 16 may comprise part of control circuitry (e.g., peripheral-under-array circuitry and/or a common source line or plate) used to control read and write access to the transistors and/or memory cells that will be formed in memory-array region 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial.

Stack 18 comprises a through-array-via (TAV) region (e.g., any one of regions 19, 21) and an operative memory-cell-string region 23. An "operative memory-cell string region" contains circuit-operative memory-cell strings in the finished construction of integrated circuitry that has been or is being fabricated. Dummy memory-cell strings (i.e., circuit-inoperative memory-cell strings comprising inoperative channel material, and not shown) may also be in operative memory-cell-string region 23 and/or in a TAV region. A "TAV region" is a region in which operative TAVs are present or will be formed. An "operative TAV" is a circuit-operative conductive interconnect extending through stack 18 and between electronic components at different elevations in a finished construction of integrated circuitry that has been or is being fabricated. A TAV region may also contain one or more dummy TAVs (i.e., a circuit-inoperative structure extending through stack 18 that may be in a finished construction of integrated circuitry that has been or is being fabricated). Regions 19/21 may essentially be undefined or indistinguishable relative one another in construction 10 at this point in processing. Example TAV region 19 (FIGS. 6 and 7) is shown as being in individual memory planes 105 (FIG. 1). Example TAV region 21 (FIGS. 8 and 9) is shown as being outside of individual memory-plane regions 105 and as being edge-of-plane (i.e., outside of a memory-plane region 105 and adjacent a lateral edge of the subject memory plane). TAV regions may also be in a stair-step region (not shown).

Channel openings 25 have been formed (e.g., by etching) through insulative tiers 20 and conductive tiers 22 to conductor tier 16. Channel openings 25 may taper radially inward moving deeper into stack 18 (not shown). In some embodiments, channel openings 25 may go partially into conductive material 17 of conductor tier 16 as shown or may stop there-atop (not shown). Alternately, as an example, channel openings 25 may stop atop or within the lowest insulative tier 20. A reason for extending channel openings 25 at least to conductive material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial. By way example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. Memory-block regions 58 and resultant memory blocks 58 (not yet shown) may be considered as being longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 2-9 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 25 followed by planarizing such back at least to a top surface of stack 18. Channel material 36 has also been formed in channel openings 25 elevationally along tiers 20 and tiers 22, thus comprising individual operative channel-material strings 53. Materials 30, 32, 34, and 36 are collectively shown as and only designated as material 37 in FIGS. 2, 3, and 6-9 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Conductive plugs (not shown) may be formed atop channel-material strings 53 for better conductive connection to overlying circuitry (not shown).

A pair of elevationally-extending walls are formed, with such walls being laterally-spaced relative one another and being individually horizontally-longitudinally-elongated. The pair of walls is one of (a) or (b), where:
(a): in the memory-plane region laterally-between immediately-laterally-adjacent of the memory-block regions; and
(b): in a region that is edge-of-plane relative to the memory-plane region.

In one embodiment, the pair of walls is (a). In one embodiment, the pair of walls is (b). In one embodiment, the pair of walls is one of two pairs of elevationally-extending walls that are laterally-spaced relative one another and that are individually horizontally-longitudinally-elongated, with one of the two pairs being (a) and the other of the two pairs being (b). For example, FIGS. 10-24 show example embodiments where two such pairs of walls are formed.

Referring to FIGS. 10-13, TAV openings 62 and wall openings 63 have been formed in each of TAV regions 19 and 21. TAV openings 62 and/or wall openings 63 may taper laterally-inward in a vertical cross-section (e.g., that of FIG. 11 or 13, and not shown) moving deeper into stack 18. TAV openings 62 and wall openings 63 may be formed at the same time or at different times (either before the other). Wall openings 63 may individually have a maximum width ($WO_m$) in a vertical cross-section (e.g., that of FIG. 11 or 13) that is smaller than, larger than, or the same as that (maximum width $TO_m$ of TAV openings 62) of individual TAV openings 62 in the vertical cross-section (smaller being shown in FIGS. 10-13).

Referring to FIGS. 14-17, in one embodiment, sidewalls of wall openings 63 and TAV openings 62 have been simultaneously lined with insulative material 61 that less-than-fills wall openings 63 and TAV openings 62. In one embodiment and as shown, the lining of the sidewalls of wall openings 63 seals tops thereof to form an internal elevationally-extending and horizontally-longitudinally-elongated and sealed void space 64 in individual of the walls being formed (e.g., walls 66 in TAV region 19 and walls 67 in TAV region 21 in what will be a finished construction). Such may occur or be facilitated by $WO_m$ being sufficiently less than $TO_m$ such that material 61 pinches-off at the top during its deposition. Regardless, in the shown example, a pair 66,66 of walls 66 has been formed in TAV region 19 and a pair 67,67 of walls 67 has been formed in TAV region 21. In one embodiment, the method is devoid of forming any interconnecting wall (none being shown) that extends laterally between pair 66,66 of walls 66 or between pair 67,67 of walls 67. Alternately, one or more interconnecting walls may be formed, for example as is analogously shown in U.S. patent application Ser. No. 16/550,252 filed on Aug. 25, 2019 and which is now U.S. Patent Publication No. 2021/0057441.

Figure 18:
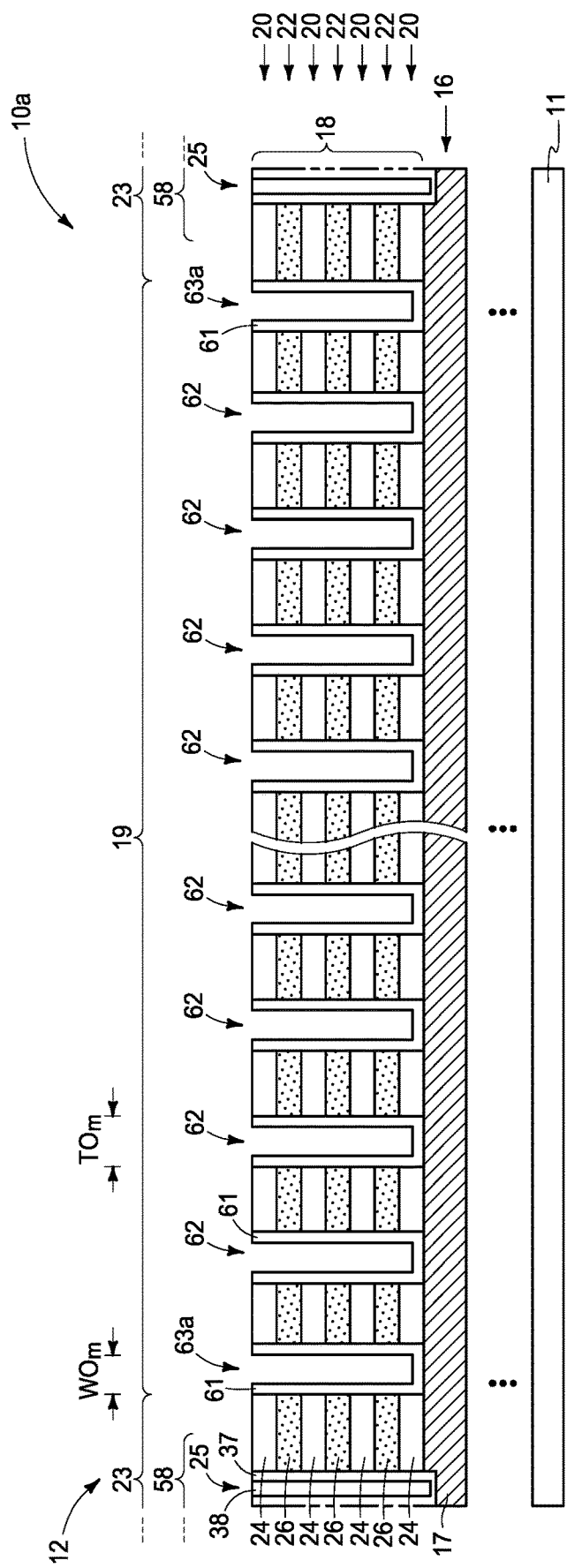
Figure 25:
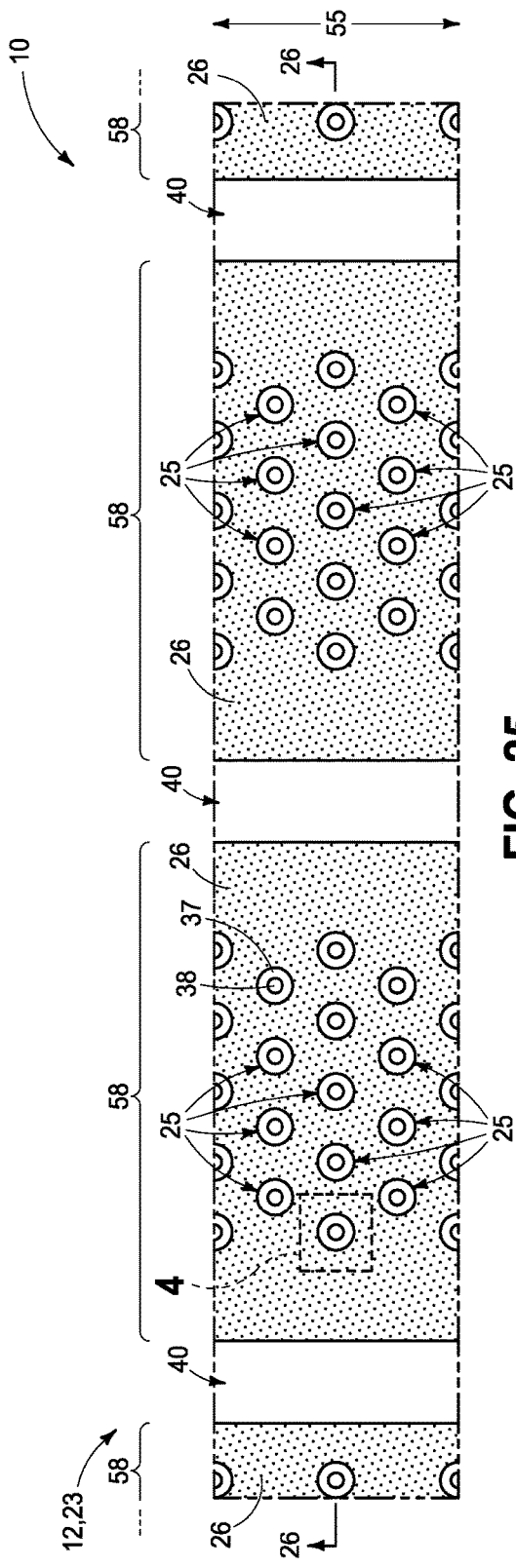
Figure 26:
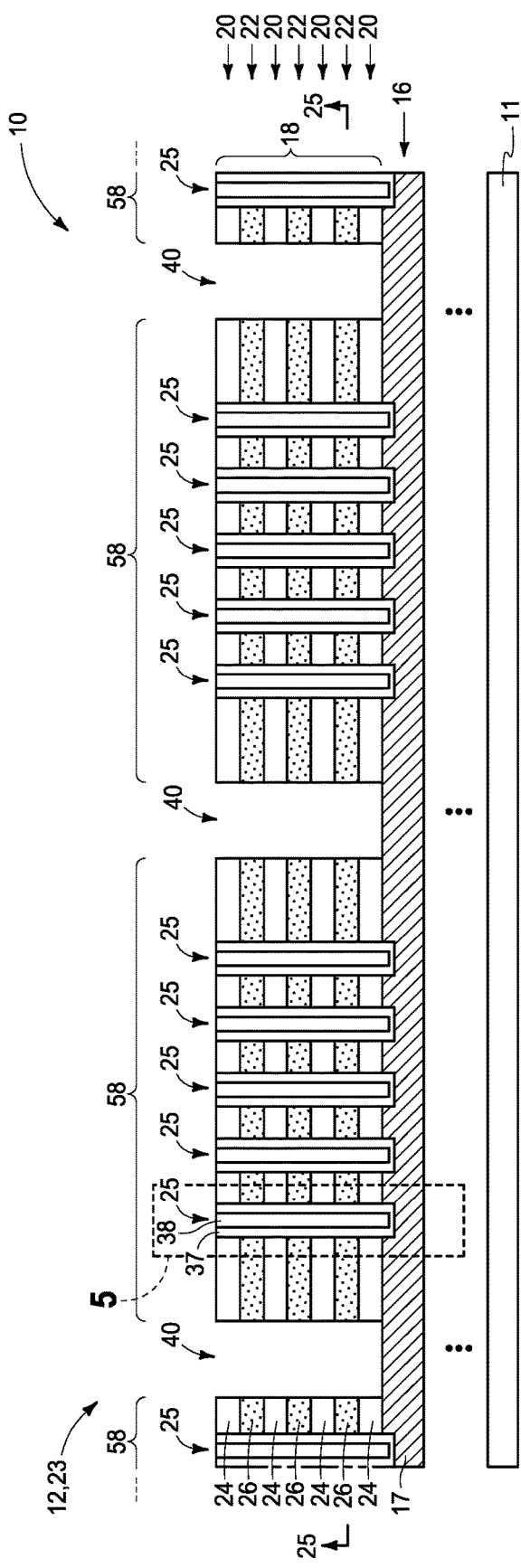
Figure 27:
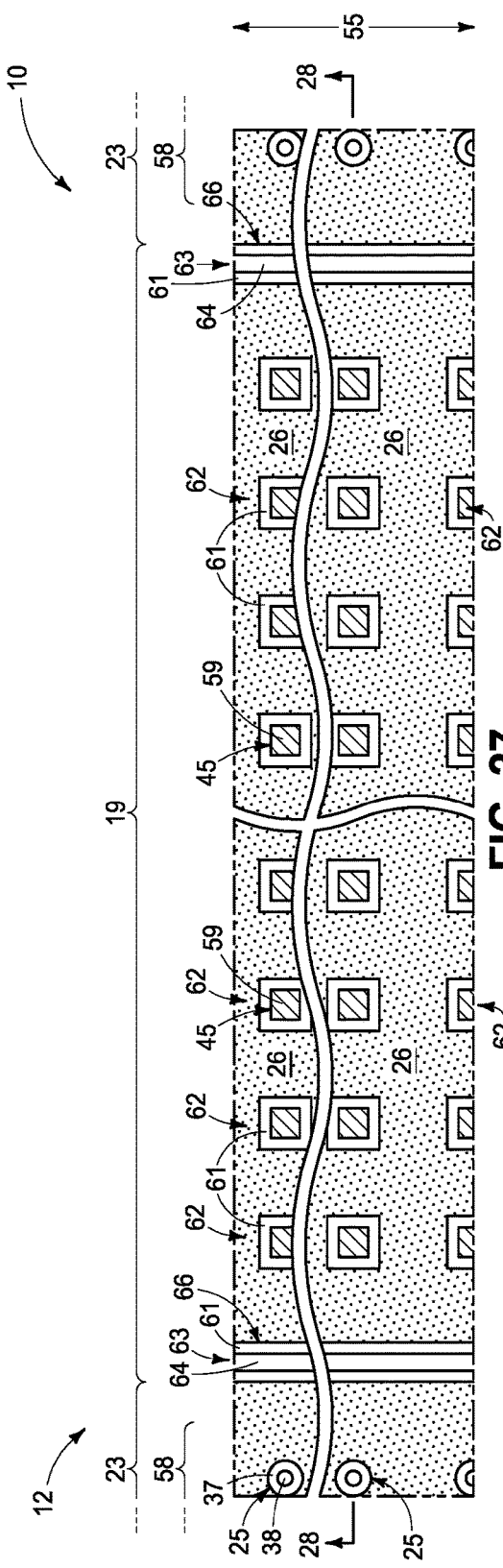
Figure 28:
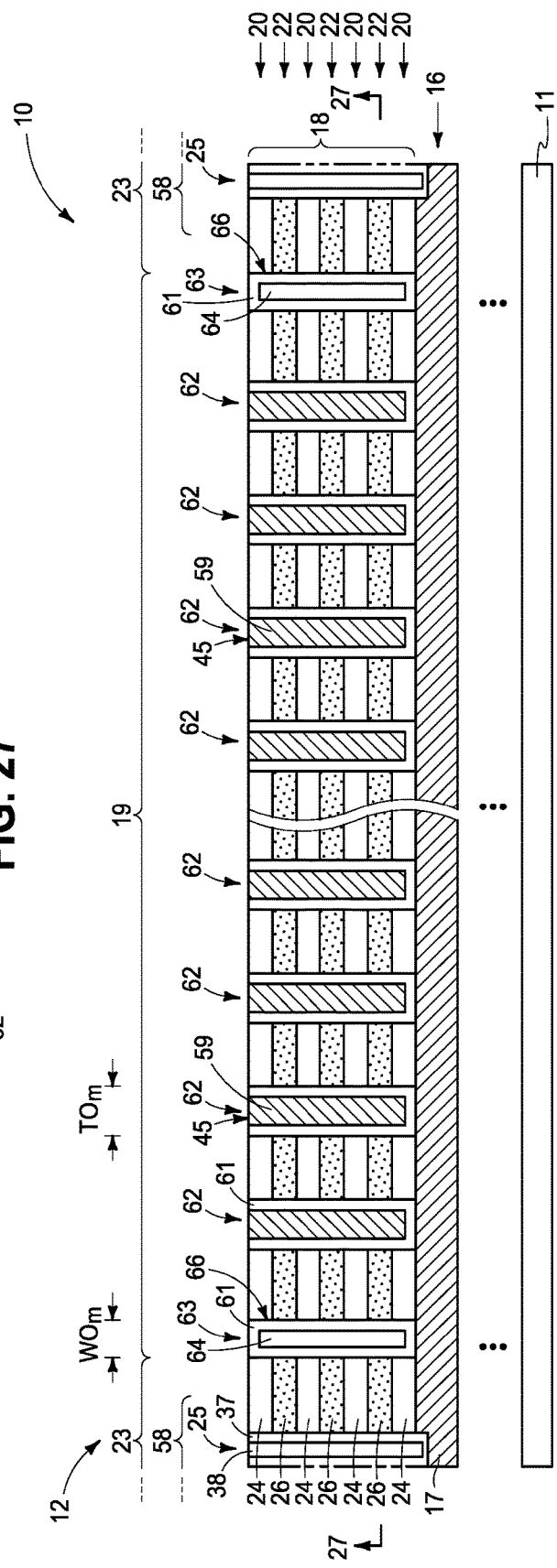
Figure 31:
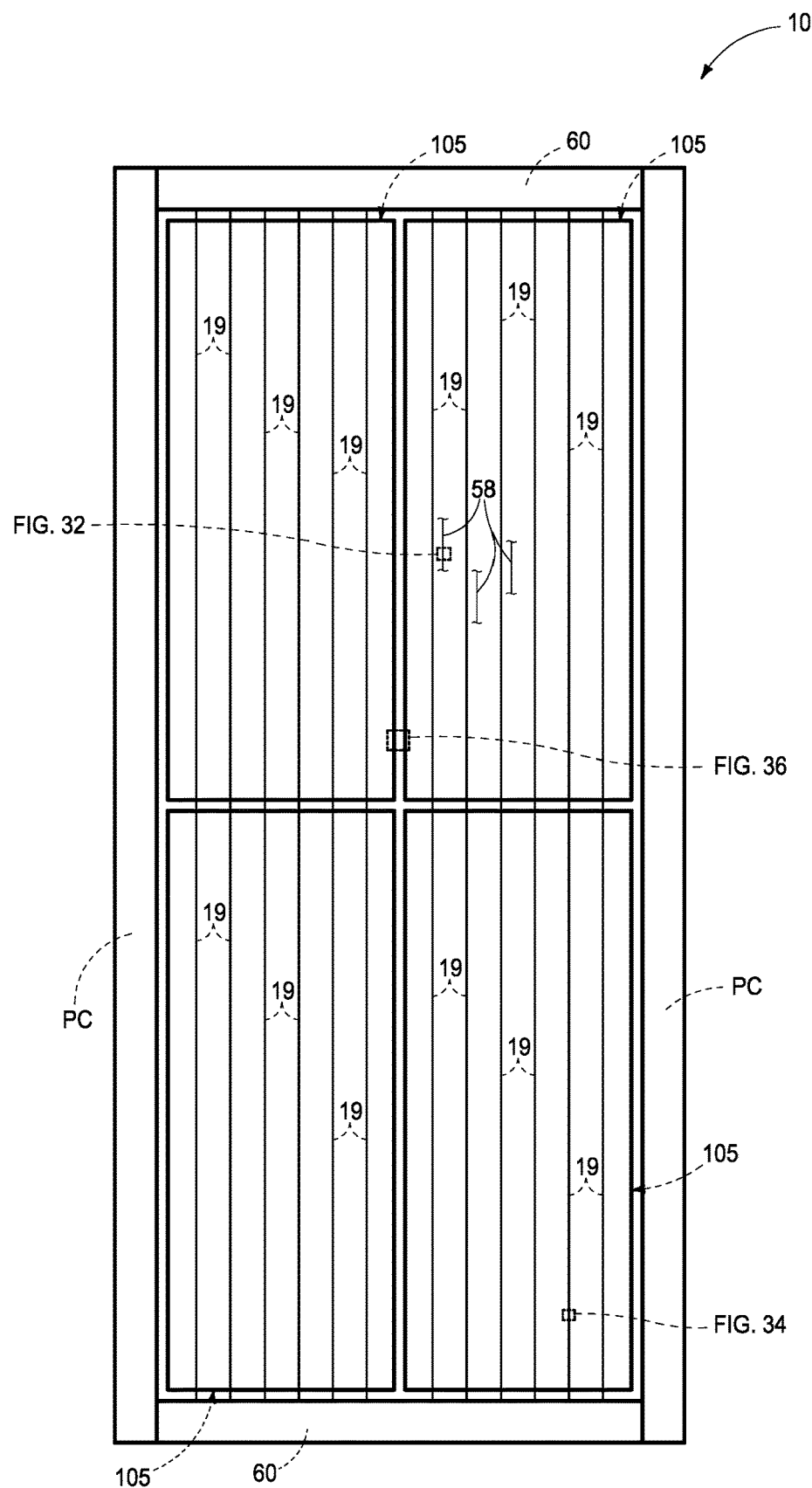
Figure 36:
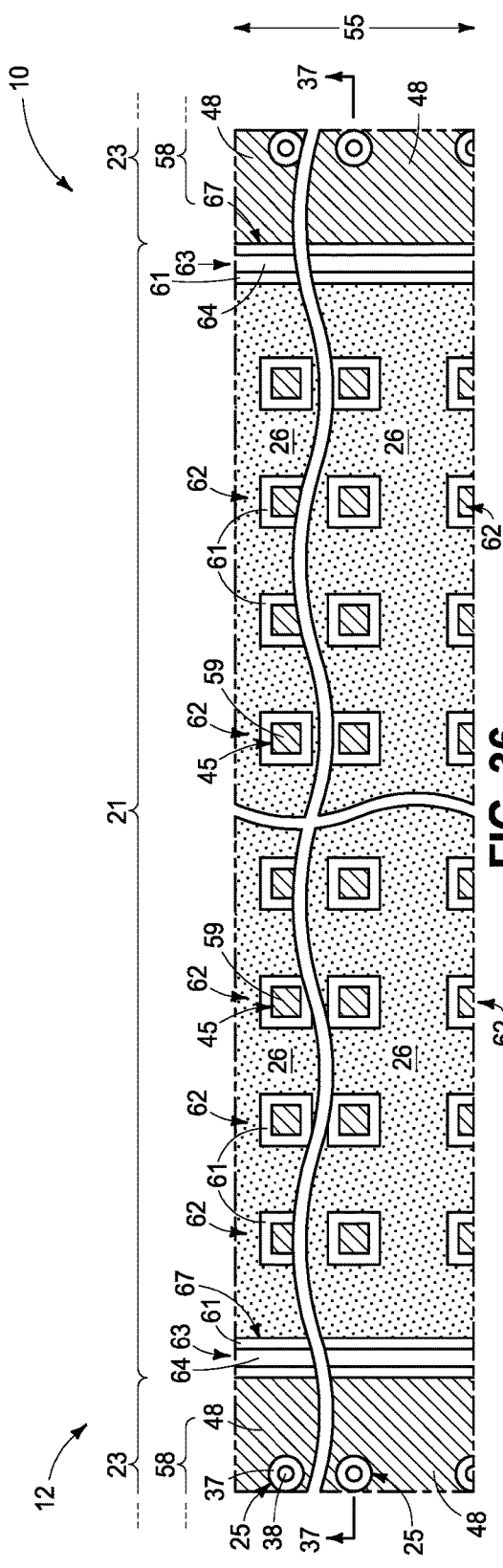
Figure 37:
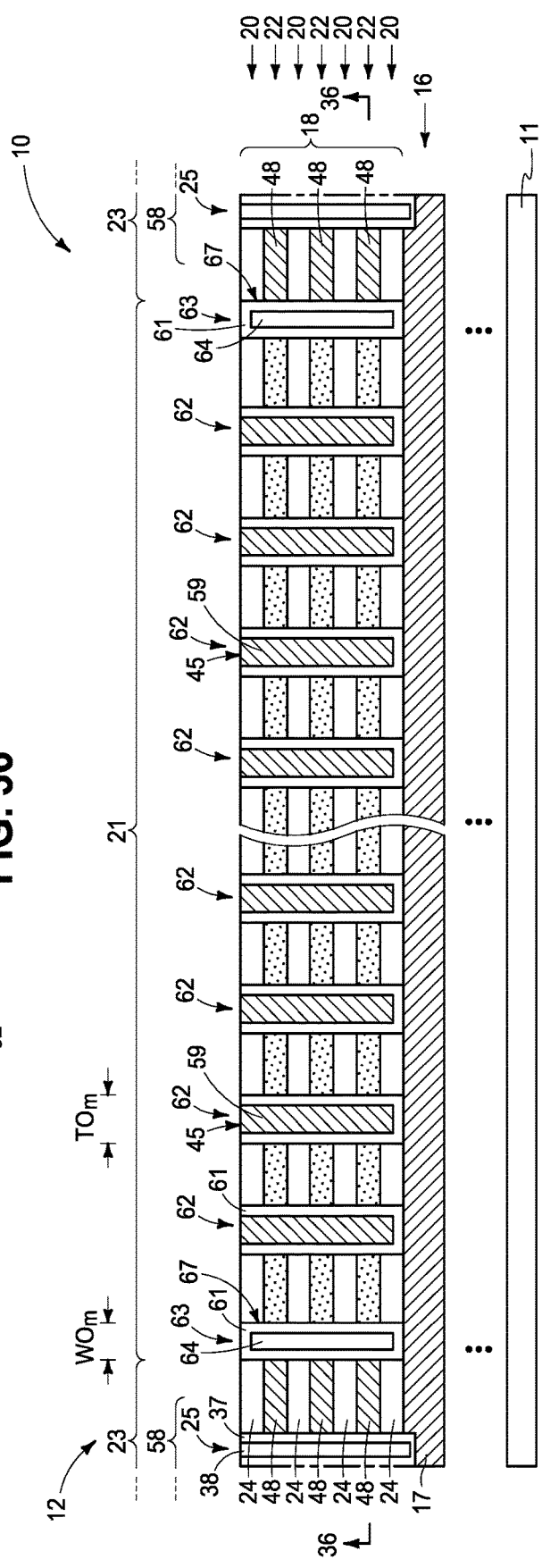
Figure 38:
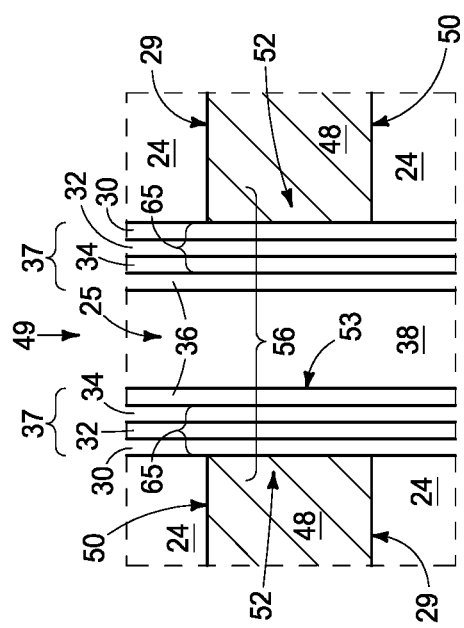

An alternate embodiment construction 10a is shown in FIG. 18. Like numerals from the above-described embodiments have been used where appropriate, with some construction differences being indicated with the suffix "a" or with different numerals. FIG. 18 corresponds to that of FIG. 15 and shows, as an example, TAV region 19. Individual wall openings 63a are shown as having $WO_m$ equal to $TO_m$, and no sealed void space being formed. Analogous structure and/or processing may occur additionally or alternately with respect to TAV region 21 (not shown). Any other attribute(s) or aspect(s) as shown and/or described herein with respect to other embodiments may be used.

Referring to FIGS. 19-22, conductive material 59 has been formed in TAV openings 62 and operative TAVs 45 have been formed therefrom. Some TAVs 45 may be dummy TAVs. In one embodiment and as shown, the method is devoid of forming operative and dummy TAVs 45 laterally-outward of the pair of walls in the (a) or the (b) (e.g., no TAV 45 being there-shown in FIGS. 19-22).

FIGS. 23 and 24 show construction 10a wherein conductive material 59 has been formed in wall openings 63a, forming a pair 66a,66a of walls 66a. In one embodiment and as shown, walls 66a individually comprise a laterally-outer insulative material 61 and a laterally-inner conductive material 59. Any other attribute(s) or aspect(s) as shown and/or described herein with respect to other embodiments may be used.

Referring to FIGS. 25-30, horizontally-elongated trenches 40 have been formed (e.g., by anisotropic etching) into stack 18 to form laterally-spaced memory-block regions 58 that are part of individual memory-plane regions 105. Trenches 40 may taper laterally-inward in a vertical cross-section (e.g., that of FIG. 26, and not shown) moving deeper into stack 18. Trenches 40 will typically be wider than channel openings 25 (e.g., 10 to 20 times wider, yet such wider degree not being shown for brevity). Trenches 40 may extend from the memory-array region 12 into stair-step region 60 (not shown). Horizontally-elongated trenches 40 may have respective bottoms that are directly against conductive material 17 (e.g., atop or within) of conductor tier 16 (as shown) or may have respective bottoms that are above conductive material 17 of conductor tier 16 (not shown). Trenches 40 may have the same maximum width as that/those of walls 66 and/or 67 (not shown) or may have different maximum width from that/those of walls 66 and/or 67 (as shown, with example trenches 40 having a greater maximum width than walls 66 and 67 in a vertical cross-section). The above processing shows forming operative channel-material strings 53 prior to forming trenches 40. Such could be reversed. Alternately, trenches 40 could be formed in between the forming and filling of channel openings 25 (not ideal). Further, the above processing shows forming operative channel-material strings 53 through second tiers 20 and first tiers 22 in memory-block regions 58 before forming walls 66 and/or 67. Such could be reversed. The above example processing shows forming wall openings 63 and horizontally-elongated trenches 40 at different times, and with horizontally-elongated trenches 40 being formed after forming walls openings 63 and walls 66 and/or 67. Alternately, such could be reversed or trenches 40 and wall openings 63 formed at the same time. In one embodiment, the method is devoid of forming a horizontally-elongated trench into the stack laterally between either one of the walls of the pair and its immediately-laterally-adjacent memory-block region (e.g., no trench 40 being shown in any of FIGS. 27-30 between region 19 are 21 and its immediately-laterally-adjacent memory-block region 58).

Referring to FIGS. 31-38, after forming pair 66,66 of walls 66 and/or after forming pair 67,67 of walls 67, sacrificial material 26 that is in first tiers 22 has been isotropically etched away through trenches 40 and has been replaced with conducting material 48 of individual conducting lines 29. Such isotropic etching is ideally conducted selectively relative to the other exposed materials including walls 66 and/or 67 (e.g., using liquid or vapor $H_3PO_4$ as a primary etchant where material 26 is silicon nitride, and other materials comprise one or more oxides or polysilicon). Walls 66 and/or 67 during such example isotropic etching may restrict lateral access of etching fluid from passing to encroach upon TAVs 45. Walls 66 and/or 67 may be laterally etched at least somewhat by the etchant.

Conducting material 48 has been removed from trenches 40 thus forming individual conducting lines 29 (e.g., wordlines) and elevationally-extending strings 49 of individual transistors and/or memory cells 56. Conductive interconnect lines (not shown) may operatively electrically couple individual operative TAVs 45 and individual operative channel-material strings 53 to other circuitry (not shown) not particularly material to the inventions disclosed herein. A thin insulative liner (e.g., $Al_2O_3$ and not shown) may be formed before forming conducting material 48. Approximate locations of transistors and/or memory cells 56 are indicated with a bracket in FIG. 38 and some with dashed outlines in others of figures, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 38) corresponding to control-gate regions 52 of individual transistors and/or memory cells 56. Control-gate regions 52 in the depicted embodiment comprise individual portions of individual conducting lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming trenches 40. Alternately, the conducting material of the conductive tiers may be formed before forming trenches 40 and/or before forming walls 66 and/or 67 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include TAVs (not shown). In one embodiment and as shown, walls 66 and/or 67 individually have a maximum width in a vertical cross-section that is smaller than that of intervening material 57 that is laterally-between immediately laterally-adjacent of laterally-spaced memory blocks 58 in the vertical cross-section.

Figure 39:
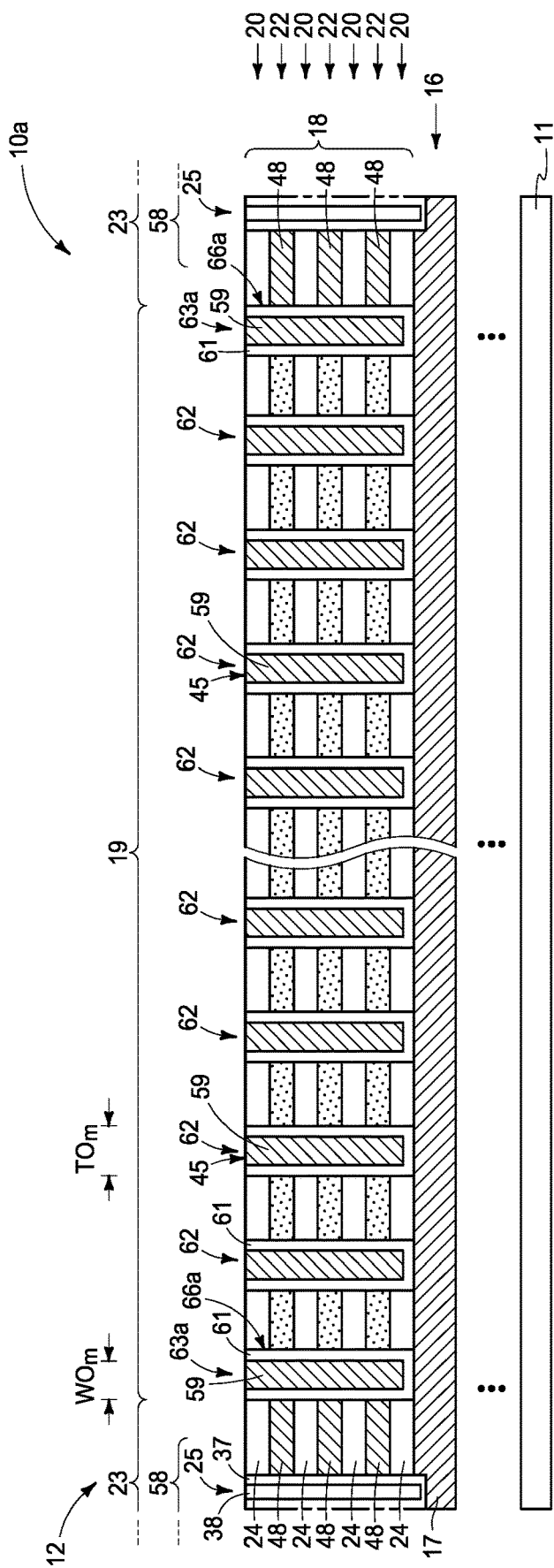

FIG. 39 shows an example final construction 10a corresponding to that of FIG. 35. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

Embodiments of the invention include a memory array (or memory array region, e.g., 12) comprising strings (e.g., 49) of memory cells (e.g., 56). Such embodiments comprise laterally-spaced memory blocks (e.g., 58) individually comprising a vertical stack (e.g., 18) comprising alternating insulative tiers (e.g., 20) and conductive tiers (e.g., 22). Operative channel-material strings (e.g., 53) of memory cells (e.g., 56) extend through the insulative tiers and the conductive tiers. The operative channel-material strings in the laterally-spaced memory blocks comprise part of a memory plane (e.g., 105).

In one embodiment, the memory array includes a pair (e.g., 66,66) of elevationally-extending walls (e.g., 66) that are laterally-spaced relative one another and that are individually horizontally-longitudinally-elongated, with the pair of walls being in the memory-plane laterally-between immediately-laterally-adjacent of the memory blocks. Any other attribute(s) or aspect(s) as shown and/or described herein with respect to other embodiments may be used.

In one embodiment, the memory array includes a pair (e.g., 67,67) of elevationally-extending walls (e.g., 67) that are laterally-spaced relative one another and that are individually horizontally-longitudinally-elongated, with the pair of walls being edge-of-plane. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers. Horizontally-elongated trenches are formed into the stack to form laterally-spaced memory-block regions. The memory-block regions comprise part of a memory-plane region. A pair of elevationally-extending walls are formed that are laterally-spaced relative one another and that are individually horizontally-longitudinally-elongated. The pair of walls are one of (a) or (b), where: (a): in the memory-plane region laterally-between immediately-laterally-adjacent of the memory-block regions; and (b): in a region that is edge-of-plane relative to the memory-plane region. Through the horizontally-elongated trenches and after forming the pair of walls, sacrificial material that is in the first tiers is isotropically etching away and replaced with conducting material of individual conducting lines.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. The operative channel-material strings in the laterally-spaced memory blocks comprise part of a memory plane. The memory array comprises a pair of elevationally-extending walls that are laterally-spaced relative one another and that are individually horizontally-longitudinally-elongated. The pair of walls are in the memory-plane laterally-between immediately-laterally-adjacent of the memory blocks.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. The operative channel-material strings in the laterally-spaced memory blocks comprising part of a memory plane. The memory array comprises a pair of elevationally-extending walls that are laterally-spaced relative one another and that are individually horizontally-longitudinally-elongated. The pair of walls are edge-of-plane.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming integrated circuitry comprising a memory array comprising strings of memory cells, comprising:
   forming a stack across multiple memory plane regions, the stack comprising vertically-alternating first tiers and second tiers;

forming horizontally-elongated trenches into the stack to form laterally-spaced memory-block regions, the memory-block regions comprising part of one memory-plane region of the multiple memory-plane regions;

forming first through-array via (TAV) regions and second TAV regions, the first TAV regions being disposed between adjacent of the laterally-spaced memory-block regions, the second TAV regions being disposed edge-of-plane laterally-between two immediately-laterally-adjacent of the multiple memory-plane regions;

forming a pair of elevationally-extending walls, the elevationally-extending walls being horizontally-longitudinally-elongated, the pair of walls being formed within one TAV region comprised by the first and second TAV regions;

forming a plurality of openings in the one TAV region between the pair of elevationally-extending walls, the plurality of openings being arranged in a grid of openings comprising horizontal rows and horizontal columns; and through the horizontally-elongated trenches and after forming the pair of walls, isotropically etching away and replacing sacrificial material that is in the first tiers with conducting material of individual conducting lines, the walls remaining in a finished construction of the integrated circuitry.

2. The method of claim 1 wherein the one TAV region is comprised by the first TAV regions.

3. The method of claim 1 wherein the one TAV region is comprised by the second TAV regions.

4. The method of claim 1 wherein the pair of elevationally-extending walls is a first pair of elevationally-extending walls and the one TAV region is a first TAV region and further comprising forming a second pair of elevationally-extending walls within one of the second TAV regions.

5. The method of claim 1 being devoid of forming operative and dummy TAVs laterally-outward of the pair of elevationally-extending walls.

6. The method of claim 1 wherein the method is devoid of forming a horizontally-elongated trench into the stack laterally between either one of the elevationally-extending walls of the pair and its immediately-laterally-adjacent memory-block region.

7. The method of claim 1 being devoid of forming any interconnecting wall that extends laterally between the pair of elevationally-extending walls.

8. The method of claim 1 further comprising forming operative TAVs in TAV openings in the one TAV region, the elevationally-extending walls being formed in wall openings, the wall openings and the TAV openings being formed at the same time.

9. The method of claim 1 further comprising forming operative TAVs in TAV openings in the one TAV region, the elevationally-extending walls being formed in wall openings, the wall openings and the TAV openings being formed at different times.

10. The method of claim 1 wherein the horizontally-elongated trenches are formed after forming the elevationally-extending walls.

11. The method of claim 1 wherein the elevationally-extending walls are formed in wall openings, the wall openings and the horizontally-elongated trenches being formed at different times.

12. The method of claim 11 wherein the horizontally-elongated trenches are formed after forming the elevationally-extending walls.

13. The method of claim 1 comprising forming the elevationally-extending walls to individually have a maximum width in a vertical cross-section that is smaller than that of individual of the horizontally-elongated trenches in the vertical cross-section.

14. The method of claim 1 further comprising forming operative TAVs in TAV openings in the one TAV region, the elevationally-extending walls being formed in wall openings, the wall openings individually having a maximum width in a vertical cross-section that is smaller than that of individual of the TAV openings in the vertical cross-section.

15. The method of claim 1 further comprising forming operative TAVs in TAV openings in the one TAV region, the elevationally-extending walls being formed in wall openings, the wall openings individually having a maximum width in a vertical cross-section that is the same as that of individual of the TAV openings in the vertical cross-section.

16. The method of claim 1 comprising forming the elevationally-extending walls to individually have an internal elevationally-extending and horizontally-longitudinally-elongated and sealed void space in the finished construction of the integrated circuitry.

17. The method of claim 1 comprising forming the elevationally-extending walls to individually comprise a laterally-outer insulative material and a laterally-inner conductive material.

18. The method of claim 1 further comprising forming operative TAVs in TAV openings in the one TAV region, the walls being formed in wall openings; and
simultaneously lining sidewalls of the wall openings and the TAV openings with insulative material that less-than-fills the wall openings and the TAV openings.

19. A method used in forming integrated circuitry comprising a memory array comprising strings of memory cells, comprising:

forming a stack comprising vertically-alternating first tiers and second tiers;

forming horizontally-elongated trenches into the stack to form laterally-spaced memory-block regions, the memory-block regions comprising part of a memory-plane region, the laterally-spaced memory-block regions comprising a first memory-block and a second memory-block, the first memory-block being spaced from the second memory-block by a through-array via (TAV region;

forming a pair of elevationally-extending walls within the TAV region, the pair of elevationally-extending walls being laterally-spaced relative one another through the horizontally-elongated trenches and after forming the pair of elevationally-extending walls, isotropically etching away and replacing sacrificial material that is in the first tiers with conducting material of individual conducting lines;

forming operative TAVs in TAV openings in the TAV region, the walls being formed in wall openings;

simultaneously lining sidewalls of the wall openings and the TAV openings with insulative material that less-than-fills the wall openings and the TAV openings; and sealing tops of the wall openings to form an internal elevationally-extending and horizontally-longitudinally-elongated and sealed void space in individual of the walls in a finished construction of the integrated circuitry.

20. The method of claim 18 comprising, after lining the sidewalls with insulative material, simultaneously forming conductive material in the TAV openings and in the wall openings.

21. The method of claim 1 comprising forming individual memory cells of the strings of memory cells to comprise channel material of operative channel-material strings, a gate region that is part of one of the conductive lines in individual of the first tiers, and a memory structure laterally-between the gate region and the channel material of the operative channel-material strings in the individual first tiers.

22. The method of claim 1 comprising forming operative channel-material strings through the second tiers and the first tiers in the memory-block regions before forming the elevationally-extending walls.

23. A method used in forming a memory array comprising strings of memory cells, comprising:
- forming a stack comprising vertically-alternating first tiers and second tiers;
- forming a pair of elevationally-extending walls that are laterally-spaced relative one another and that are individually horizontally-longitudinally-elongated;
- after forming the pair of elevationally-extending walls, forming horizontally-elongated trenches into the stack to form laterally-spaced memory-block regions, the memory-block regions comprising part of a memory-plane region; the pair of walls being one of (a) or (b), where:
  - (a): in the memory-plane region laterally-between immediately-laterally-adjacent of the memory-block regions; and
  - (b): in a region that is edge-of-plane relative to the memory-plane region;
- through the horizontally-elongated trenches, isotropically etching away and replacing sacrificial material that is in the first tiers with conducting material of individual conducting lines; and
- forming operative channel-material strings through the second tiers and the first tiers in the memory-block regions after forming the walls.

* * * * *